United States Patent
Kim et al.

(10) Patent No.: US 9,837,163 B2
(45) Date of Patent: Dec. 5, 2017

(54) METHODS FOR MANAGING OPERATIONS IN NONVOLATILE MEMORY DEVICE

(71) Applicants: Kyungryun Kim, Seoul (KR); Goeun Jung, Hwaseong-si (KR); Sang-Hyun Joo, Suwon-si (KR); Kyehyun Kyung, Yongin-si (KR)

(72) Inventors: Kyungryun Kim, Seoul (KR); Goeun Jung, Hwaseong-si (KR); Sang-Hyun Joo, Suwon-si (KR); Kyehyun Kyung, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 261 days.

(21) Appl. No.: 14/491,123

(22) Filed: Sep. 19, 2014

(65) Prior Publication Data

US 2015/0179274 A1    Jun. 25, 2015

(30) Foreign Application Priority Data

Dec. 24, 2013  (KR) .................. 10-2013-0162710

(51) Int. Cl.

| G06F 12/00 | (2006.01) |
| G06F 13/00 | (2006.01) |
| G11C 16/34 | (2006.01) |
| G11C 16/04 | (2006.01) |

(52) U.S. Cl.
CPC ...... *G11C 16/3418* (2013.01); *G11C 16/0466* (2013.01); *G11C 16/0483* (2013.01)

(58) Field of Classification Search
CPC ............ G06F 12/0238; G06F 12/0246; G06F 2212/2022; G06F 2212/72; G06F 2212/7204; G11C 11/5621; G11C 11/5642; G11C 11/5671; G11C 13/0035; G11C 16/349; G11C 16/3495

USPC .......................................................... 711/103
See application file for complete search history.

(56) References Cited

U.S. PATENT DOCUMENTS

| 6,858,906 B2 | 2/2005 | Lee et al. |
| 7,127,551 B2 | 10/2006 | Beck |
| 7,366,826 B2 | 4/2008 | Gorobets et al. |
| 7,623,366 B2 | 11/2009 | Park et al. |
| 7,657,702 B2 | 2/2010 | Conley |
| 7,978,521 B2 | 7/2011 | Son et al. |
| 8,040,744 B2 | 10/2011 | Gorobets et al. |
| 8,041,884 B2 | 10/2011 | Chang |
| 8,352,808 B2 | 1/2013 | Kim et al. |

(Continued)

FOREIGN PATENT DOCUMENTS

| KR | 10-0673020 B1 | 1/2007 |
| KR | 10-2010-0006712 A | 1/2010 |

*Primary Examiner* — Sean D Rossiter
(74) *Attorney, Agent, or Firm* — Harness, Dickey & Pierce, P.L.C.

(57) ABSTRACT

One embodiment includes obtaining programming order information for the memory area from a first table based on address information. The programming order information indicates an order in which the memory area was programmed. The embodiment further includes determining an estimated elapsed time by accessing a second table based on the obtained programming order information. The estimated elapsed time indicating time that has elapsed since the portion of the memory area was last programmed. The embodiment includes controlling the memory based on the estimated elapsed time.

21 Claims, 25 Drawing Sheets

(56) References Cited

U.S. PATENT DOCUMENTS

| | | |
|---|---|---|
| 8,397,014 B2 | 3/2013 | Khmelnitsky et al. |
| 8,516,219 B2 | 8/2013 | Post et al. |
| 8,633,104 B2 | 1/2014 | Pyo et al. |
| 2003/0047755 A1 | 3/2003 | Lee et al. |
| 2004/0169238 A1 | 9/2004 | Lee et al. |
| 2006/0155921 A1* | 7/2006 | Gorobets ............ G06F 12/0246 711/103 |
| 2006/0180851 A1 | 8/2006 | Lee et al. |
| 2008/0077842 A1* | 3/2008 | Gonzalez ............. G11C 16/349 714/763 |
| 2008/0270680 A1 | 10/2008 | Chang |
| 2009/0123785 A1* | 5/2009 | Muramatsu ....... H01M 8/04194 429/425 |
| 2009/0150601 A1* | 6/2009 | Conley ............... G06F 12/0246 711/103 |
| 2009/0198947 A1 | 8/2009 | Khmelnitsky et al. |
| 2010/0005225 A1 | 1/2010 | Honda et al. |
| 2010/0008146 A1 | 1/2010 | Son et al. |
| 2010/0172179 A1 | 7/2010 | Gorobets et al. |
| 2011/0022819 A1 | 1/2011 | Post et al. |
| 2011/0119564 A1* | 5/2011 | Kim .................... G06F 11/1068 714/773 |
| 2012/0008414 A1 | 1/2012 | Katz et al. |
| 2012/0033503 A1* | 2/2012 | Kim ....................... G11C 16/16 365/185.33 |
| 2012/0051133 A1 | 3/2012 | Kanda |
| 2012/0054419 A1 | 3/2012 | Chen et al. |
| 2012/0294104 A1* | 11/2012 | Mun ....................... G11C 11/56 365/218 |
| 2013/0051146 A1 | 2/2013 | Yun et al. |
| 2013/0173854 A1 | 7/2013 | Shim et al. |
| 2013/0238836 A1* | 9/2013 | Suzuki ................ G11C 16/3431 711/103 |
| 2013/0290597 A1* | 10/2013 | Faber ................. G06F 12/0238 711/102 |
| 2013/0326312 A1* | 12/2013 | Lee .................... G06F 11/1068 714/773 |
| 2015/0262694 A1* | 9/2015 | Seo .................... G06F 11/1068 714/764 |
| 2016/0004437 A1* | 1/2016 | Kim ..................... G11C 29/021 714/764 |

\* cited by examiner

Fig. 4B
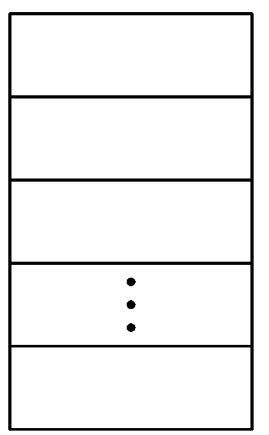
Block address: 245
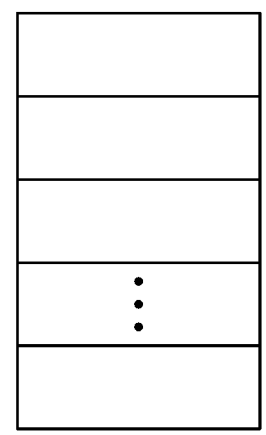
Block address: 102
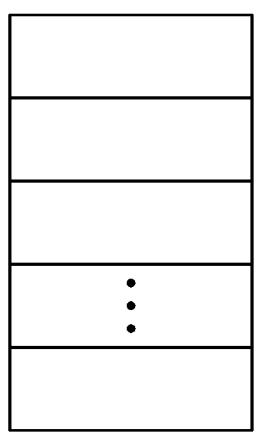
Block address: 245
Select new block

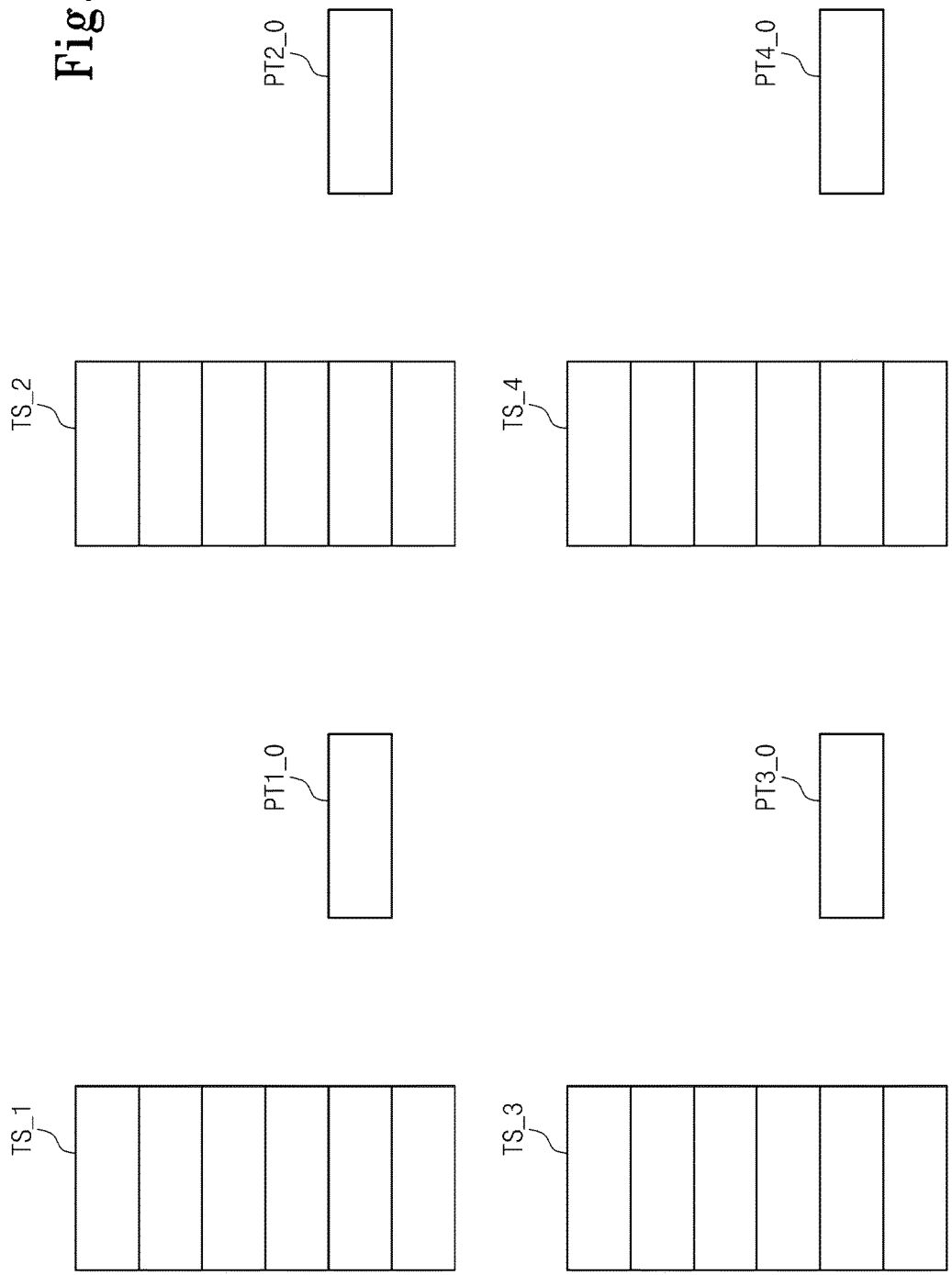

METHODS FOR MANAGING OPERATIONS IN NONVOLATILE MEMORY DEVICE

CROSS-REFERENCE TO RELATED APPLICATIONS

A claim for priority under 35 U.S.C. §119 is made to Korean Patent Application No. 10-2013-0162710 filed Dec. 24, 2013, in the Korean Intellectual Property Office, the entire contents of which are hereby incorporated by reference.

BACKGROUND

The inventive concepts described herein relate to a semiconductor memory device, and more particularly, relate to a nonvolatile memory device and/or a memory controller to control the nonvolatile memory device.

Semiconductor memories are usually considered to be the most vital microelectronic component of digital logic system design, such as computers and microprocessor-based applications ranging from satellites to consumer electronics. Therefore, advances in the fabrication of semiconductor memories including process enhancements and technology developments through scaling for higher densities and faster speeds help establish performance standards for other digital logic families.

Semiconductor memory devices may be characterized as volatile random access memories (RAMs), or non-volatile memory devices. In RAMs, the logic information is stored either by setting the logic state of a bistable flip-flop such as in a static random access memory (SRAM), or through the charging of a capacitor as in a dynamic random access memory (DRAM). In either case, the data are stored and can be read out as long as the power is applied, and the data are lost when the power is turned off; hence, these memories are called volatile memories.

Non-volatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of storing the data, even with the power is turned off. The non-volatile memory data storage mode may be permanent or reprogrammable, depending upon the fabrication technology used. Non-volatile memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvSRAM) for use in systems that require fast, programmable non-volatile memory. In addition, dozens of special memory architectures have evolved which contain some additional logic circuitry to optimize their performance for application-specific tasks.

A Charge Trap Flash (CTF) technology is being applied to a nonvolatile memory device. The CTF technology is a semiconductor memory technique used to implement non-volatile NOR and NAND flash memories. The CTF technology is different from conventional floating gate MOSFET technology in that it uses a silicon nitride film to store electrons rather than the doped polycrystalline silicon typical of a floating gate structure. This approach allows memory manufacturers to reduce manufacturing costs five ways: (1) Fewer process steps are required to form a charge storage node, (2) Smaller process geometries can be used (therefore reducing chip size and cost), (3) Multiple bits can be stored on a single flash memory cell, (4) Improved reliability, and (5) Higher yield since the charge trap is less susceptible to point defects in the tunnel oxide layer.

SUMMARY

At least one embodiment relates to a method of controlling a memory based on program elapsed time.

One embodiment includes obtaining programming order information for the memory area from a first table based on address information. The programming order information indicates an order in which the memory area was programmed. The embodiment further includes determining an estimated elapsed time by accessing a second table based on the obtained programming order information. The estimated elapsed time indicating time that has elapsed since the portion of the memory area was last programmed. The embodiment includes controlling the memory based on the estimated elapsed time.

Another embodiment includes receiving a read request for at least a portion of a memory area of a memory, the read request including read address information for the portion of the memory area, and obtaining programming order information for the memory area from a first table based on the read address information. The programming order information indicates an order in which the memory area was programmed. The embodiment includes determining an estimated elapsed time by accessing a second table based on the obtained programming order information. The estimated elapsed time indicates time that has elapsed since the portion of the memory area was last programmed. The embodiment further includes obtaining read condition information based on the estimated elapsed time, and reading data from the portion of the memory area based on the obtained read condition information.

At least one embodiment relates to managing information used to determine the program elapsed time.

One embodiment includes programming data into at least a portion of a memory area in a memory, and storing address information for the memory area in a first table. The first table stores the address information based on an order in which the memory area was programmed with respect to other memory areas having address information stored in the first table. The embodiment further includes determining an index of the portion of the memory area based on write address information received with the data, and storing the index in one of a plurality of entries of a second table. The second table stores the index based on an order in which the portion was programmed with respect to other portions having indexes stored in the second table. Each of the plurality of entries is associated with an elapsed time. The elapsed time indicates a time that has elapsed since programming the portion stored in the entry.

At least one embodiment relates to a memory controller.

In one embodiment, the memory controller includes a buffer and a processor. The buffer is configured to store a first table and a second table. The first table is configured to store address information for a plurality of memory areas of a memory in an order in which the memory areas area programmed. Each of the memory areas is divided into a plurality of memory units. The second table includes a plurality of entries, each of the plurality of entries is configured to store an index associated with one of the memory units in the plurality of memory areas, and each of the plurality of entries is associated with a different elapsed time. The elapsed time indicates a time since the memory unit associated with the index stored in the entry was programmed, and the buffer is configured to store respective read condition information associated with the elapsed time. A processor is configured to receive a read request for at least one memory unit of memory area of a memory, and the read request includes read address information. The processor is configured to obtain programming order information based on the first table and the read address information. The programming order information indicates an order in which the memory area was programmed. The processor is configured to determine an index of the memory unit based on the obtained programming order information, and to determine an estimated elapsed time by accessing the second table using the determined index. The processor is configured to obtain read condition information corresponding to the estimated elapsed time from the buffer, and the processor configured to control the memory to read data from the memory unit of the memory area using the read condition information.

BRIEF DESCRIPTION OF THE FIGURES

The above and other objects and features will become apparent from the following description with reference to the following figures, wherein like reference numerals refer to like parts throughout the various figures unless otherwise specified, and wherein

FIGS. 4A to 4C are diagrams for describing an indexing method according to an embodiment of the inventive concepts;

FIG. 6 illustrates a data structure for managing the relationship between elapsed time and the indexes of the program units according to another example embodiment;

DETAILED DESCRIPTION

Figure 1:
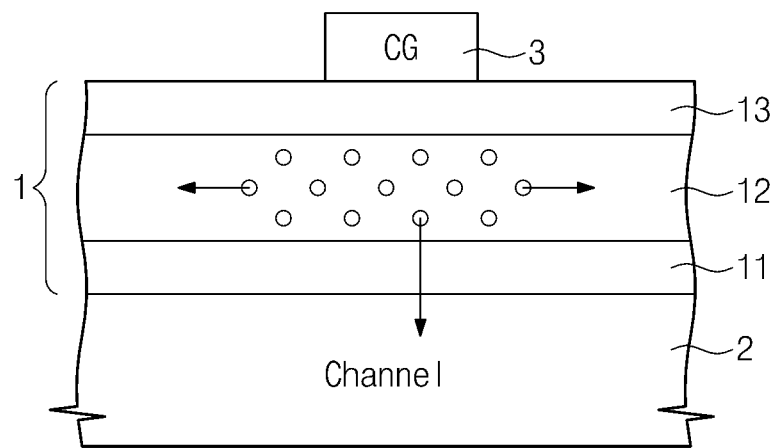
FIG. 1 is a diagram schematically illustrating a vertical structure of a charge trap flash cell.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below". "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram schematically illustrating a vertical structure of a charge trap flash cell.

Referring to FIG. 1, a Charge Trap Flash cell (hereinafter, referred to as "CTF cell") has an information storage layer 1 to store information. The information storage layer 1 includes a first oxide film 11, a nitride film 12, and a second oxide film 13 that are sequentially stacked on a channel 2. The channel 2 may include a semiconductor material (e.g., silicon). Here, the nitride film 12 may be used as a charge trap layer. The CTF cell is programmed by applying a program voltage to a control gate 3 and a desired (or, alternatively a predetermined) voltage (e.g., 0V) to the channel 2 of the CTF cell. An electric field is formed in a direction from the control gate 3 into the channel 2 under the bias condition; therefore, charges are shifted into the charge trap layer 12 from the channel 2 by the electric field. Thus, the CTF cell is programmed under this bias condition. The CTF cell is erased by applying a desired (or, alternatively a predetermined) voltage (e.g., 0V or a voltage higher than 0V) to the control gate 3 and an erase voltage (e.g., about 20V) to the channel 2 of the CTF cell. As an electric field is formed in a direction from a bulk into the control gate under this bias condition, the CTF cell is erased.

In FIG. 1, locations of charges trapped in the charge trap layer 12 through programming are merely examples. It is understood that their locations are variable according to a characteristic of the CTF cell. As time elapses, charges trapped in the charge trap layer 12 through programming may decrease due to various phenomenon such as charge rearrangement, loss into the channel 2 (refer to an arrow shown in a vertical direction in FIG. 1), migration through the nitride film 12 (refer to an arrow shown in a horizontal direction in FIG. 1), and so on. This is referred to as a fast charge loss phenomenon. If the fast charge loss phenomenon occurs, a threshold voltage of the CTF cell may become low. Also, dropping and spreading on a distribution of threshold voltages of programmed CTF cells may occur.

Figure 2:
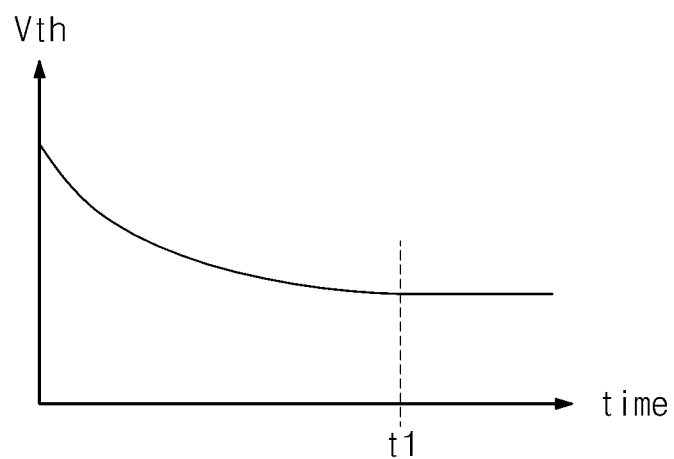
FIG. 2 is a diagram showing a variation in threshold voltage of a CTF cell due to a fast charge loss phenomenon.
Figure 3:
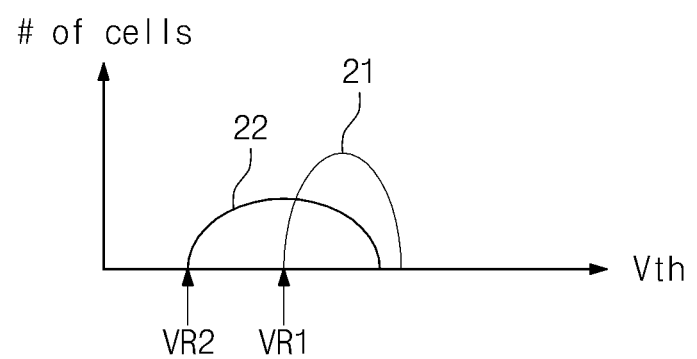
FIG. 3 is a diagram showing threshold voltage distributions varied according to a fast charge loss phenomenon.

FIG. 2 is a diagram showing a variation in threshold voltage of a CTF cell due to a fast charge loss phenomenon. FIG. 3 is a diagram showing threshold voltage distributions varied according to a fast charge loss phenomenon.

In FIG. 2, a horizontal axis indicates an elapsed time after a program operation is performed, and a vertical axis indicates a threshold voltage of a programmed CTF cell. A CTF cell may have a target threshold voltage (e.g., a voltage equal to or higher than a verification voltage) immediately after a program operation is completed. As a time elapses after a program operation is completed, a threshold voltage of the CTF cell may gradually decrease as shown in FIG. 2. The reason is that loss of trapped charges in a charge trap layer due to the above-described fast charge loss phenomenon arises. Charges thus lost affect a threshold voltage of the CTF cell. For example, a threshold voltage of the CTF cell may decrease. A variation in threshold voltage of the CTF cell means that read fail occurs. As illustrated in FIG. 2, a threshold voltage of a programmed CTF cell continuously varies until a stabilization time t1 elapses, but it does not vary after the stabilization time t1 elapses. Although such an example that a threshold voltage of a programmed CTF cell does not vary after the stabilization time t1 is illustrated in FIG. 2, its threshold voltage may vary after the stabilization time t1. Here, it is noted that the inventive concept relates to a variation in threshold voltage of a programmed CTF cell due to the fast charge loss phenomenon. A shape of a graph indicating a variation in threshold voltage is exemplary, and the inventive concepts are not limited thereto.

Referring to FIG. 3, threshold voltages of programmed CTF cells form a threshold voltage distribution (or, a target threshold voltage distribution) corresponding to "21" immediately after a program operation is executed. Data of CTF cells included in the threshold voltage distribution 21 is read using a read voltage VR1. In this case, data of the CTF cell is normally read. Threshold voltages of the programmed CTF cells form a threshold voltage distribution corresponding to "22" after a stabilization time t1 elapses. If data of CTF cells included in the threshold voltage distribution 22 is read using the read voltage VR1, it may not be read normally. That is, read fail may arise. When the read fail occurs, in general, a read operation (or, a read retry operation) may be iterated using a read voltage changed until data of the CTF cells is normally read. This means an increase in read latency.

If a read operation is performed using a read voltage VR2 decided on the basis of the threshold voltage distribution 22 formed after a program operation is performed and then the stabilization time t1 elapses, the read operation may be normally performed. However, if a read operation is performed before the stabilization time t1 elapses, as described above, the read fail may occur if the read voltage VR2 is used. This means that a read condition (e.g., a read voltage)

for a read operation to be performed between a program completion time and the stabilization time t1 should be changed. Here, it is understood that a read condition may be a read voltage or sensing condition. This will be more fully described later. The inventive concepts relate to controlling a read condition (e.g., read voltage or sensing condition) for a read operation to be performed between the program completion time and the stabilization time t1. The read condition for a read operation may be changed based on a time (hereinafter, referred to as "program lapse time") that elapses after a program operation of a CTF cell is completed, for example. It is possible to prevent the read fail due to the fast charge loss phenomenon by changing a read condition according to a program lapse time of a CTF cell. In other words, it is possible to optimize in real time the read condition for determining a threshold voltage of a CTF cell being varied by the fast charge loss phenomenon by changing a read condition according to a program lapse time of the CTF cell.

The variation in threshold voltage shown in FIG. 2 is an example. A change speed of a threshold voltage and the stabilization time t1 may not be fixed but changed according to various conditions (e.g., a page, a word line, endurance, a program mode, an erase mode, a read mode, and so on). A change speed of a threshold voltage and the stabilization time t1 may not be limited to specific speeds and times. To optimize or improve the read condition, entries including address information and program times of memory areas programmed on the basis of the stabilization time t1 may be constructed and managed. In the event that entries including address and program time information of programmed memory areas are individually managed, management overhead (or, memory resource overhead) may arise. Also, the entries will be searched to decide a read condition (or, a program lapse time) for an access requested memory area. This means that search overhead may become serious. In case of the inventive concepts, the number of entries to be managed may be considerably reduced by using such a characteristic that a program operation proceeds in a direction from a lower word line to a higher word line in a physical block. This will be more fully described later.

Figure 4A:
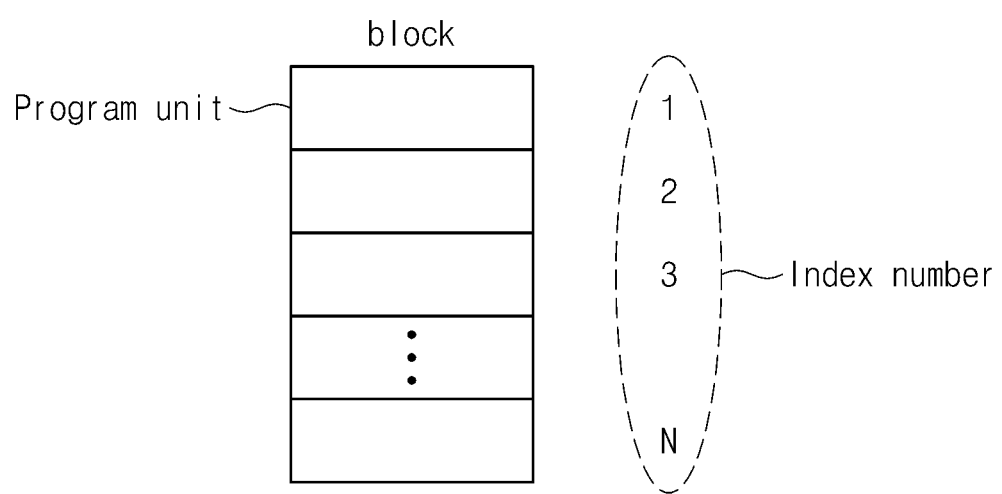
Figure 4C:
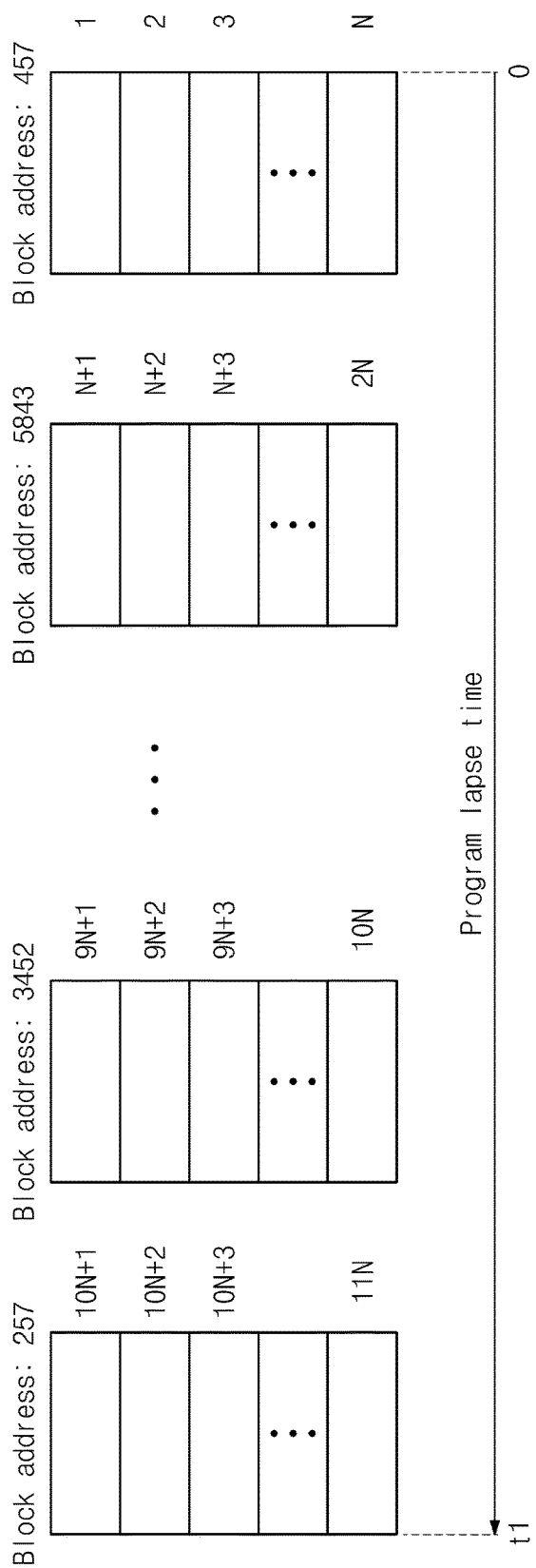

FIGS. 4A to 4C are diagrams for describing an indexing method according to an embodiment of the inventive concepts. FIG. 5 is a diagram showing a relationship between a program order and block addresses.

Referring to FIG. 4A, a memory block may include a plurality of program units. Here, a program unit may be implemented by one or more pages, one or more sectors, etc. Index values may be allocated to program units, respectively. For example, in the event that a memory block includes N program units, index values 1 to N may be allocated to program units of a memory block, respectively. Index values may be allocated when a memory block to be programmed is selected. This indexing may be equally applied to all memory blocks. In FIG. 4A, there is illustrated an example where index values increases in a drop direction, that is, from top to bottom, but program units are programmed from bottom to top on the basis of a physical location.

If a selected memory block is filled with data, another memory block is selected for programming. For example, referring to FIG. 4B, index values 1 to N are respectively allocated to program units of a memory block having a block address of 245, and a program operation about the memory block having the block address of 245 is performed. If the memory block having the block address of 245 is filled with data, a new memory block is allocated. For example, it is assumed that a memory block having a block address of 102 is the next block allocated for programming. At this time, new index values (N+1) to 2N are allocated to program units of the memory block having the block address of 245, and index values 1 to N are allocated to program units of the memory block having the block address of 102. That is, when the index values 1 to N are allocated to the program units of the memory block having the block address of 102, index values of the program units of the memory block having the block address of 245 increase by N, respectively.

With this indexing method, as illustrated in FIG. 4C, an index value increases according to an increase in program lapse time. For example, index values 1 to N of a recently programmed memory block having a block address of 457 are smaller than index values (10N+1) to 11N of a previously programmed memory block having a block address of 257. Index values of memory blocks may be managed on the basis of a stabilization time t1. This means that the number of memory blocks with index values to be managed using the stabilization time t1 is decided. Block addresses of memory blocks to be managed may be managed according to a program order.

Figure 5A:
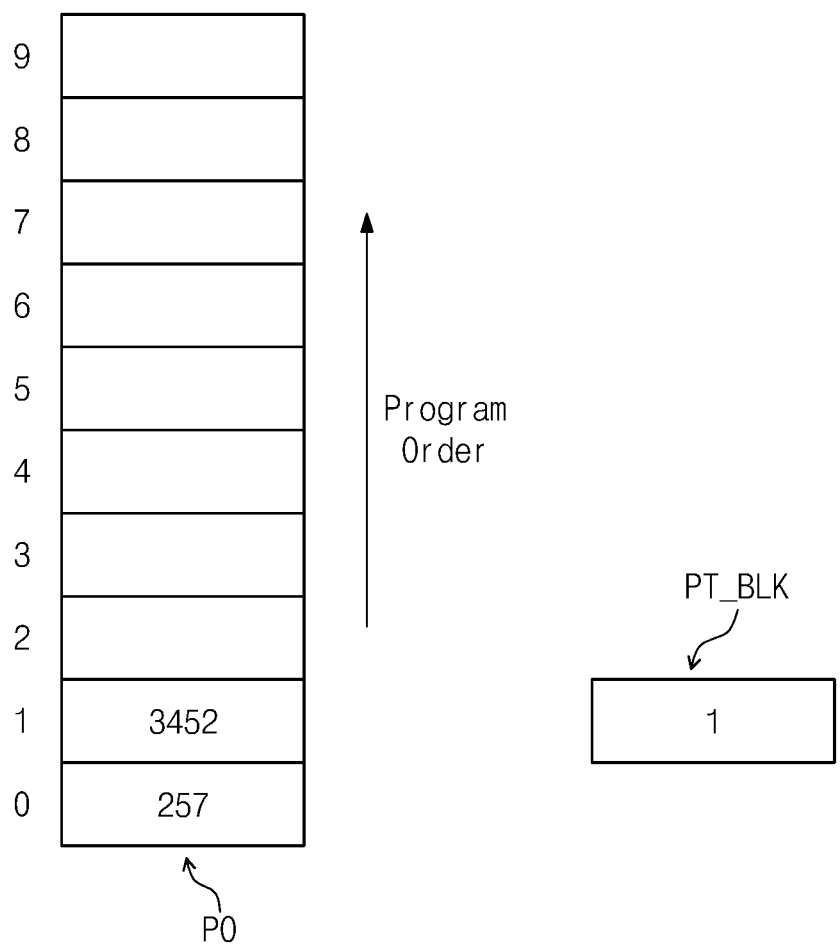
FIG. 5A illustrates a data structure for managing the program order of blocks according to an example embodiment.

FIG. 5A illustrates a data structure for managing the program order of blocks according to an example embodiment. As shown, the data structure includes a program order table PO and a most recently programmed block pointer PT_BLK. The table PO includes a number of entries. For example, the number of entries may correspond to the number of memory blocks that would be handled within the stabilization time t1. FIG. 5A illustrates the table PO having ten entries, but it will be understood that the number of entries could be greater than or less than ten. As blocks are programmed, the addresses of the blocks are recorded in the table PO from bottom to top, and then wrapping around back to the bottom.

The pointer PT_BLK points to the entry (e.g., stores the entry number) in the table PO storing the most recently programmed entry. Accordingly, older programmed blocks have addresses recorded below the pointed to entry, and wrapping around to the top of the table PO.

For purposes of discussion only, FIG. 5A shows two block addresses recorded in the table PO. The addresses 3452 and 257 are shown recorded in entries 1 and 0, respectively. FIG. 5A further shows, for discussion purposes only, that the pointer PT_BLK points to entry 1 as storing the address for the most recently programmed memory block. Accordingly, it will be understood that the memory block having address 257 was programmed before the memory block having address 3452. If more addresses were stored in the table PO, such as in entry 9, it would be understood that the memory block having the address stored in entry 9, was programmed before the memory block having address 257, and so on.

If a new memory block is recorded, the address would be stored in entry 2 of the table PO, and the pointer PT_BLK would be updated to point to entry 2. In this manner, the program order of the blocks may be managed. Furthermore, in this manner, the indexes (discussed with respect to FIG. 4A-4C) of program units recorded at particular times may be determined and managed as described in detail below.

Figure 5B:
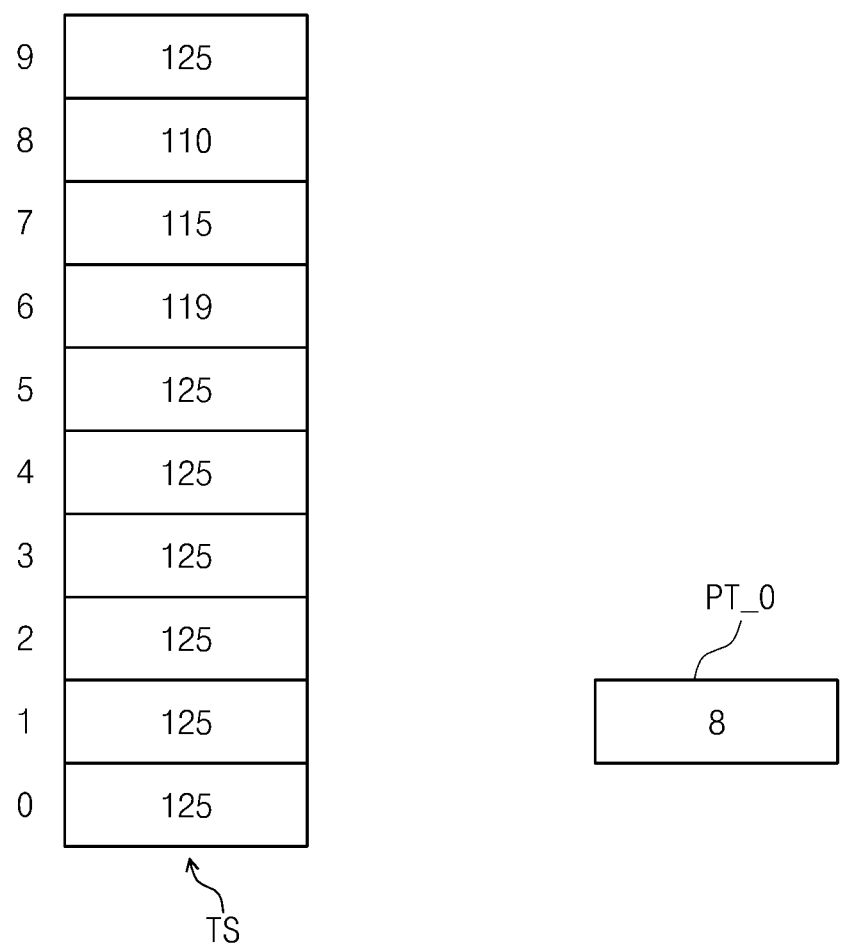
FIG. 5B illustrates a data structure for managing the relationship between elapsed time and the indexes of the program units according to an example embodiment.

FIG. 5B illustrates a data structure for managing the relationship between elapsed time and the indexes of the program units according to an example embodiment. As shown, the data structure includes a time stamp table TS and a zero pointer PT_0. The table TS includes a number of entries. For example, the number of entries may correspond to the number of indexes that would be handled within the stabilization time t1. FIG. 5B illustrates the table TS having ten entries, but it will be understood that the number of entries could be greater than or less than ten.

The pointer PT_0 points to the entry (e.g., stores the entry number) in the table corresponding to the current time. The pointer PT_0 is shifted to the next higher entry at a desired (or, alternatively, a predetermined) time interval. For example, the time interval may be 0.01 seconds. Namely, regardless of whether data is recorded and a new index is to be stored in the table TS, the pointer PT_0 is updated.

At power on, each entry of the table TS may be populated with the index of the last programmed program unit, and the pointer PT_0 is initialized to point to the entry 0. Alternatively, each entry may be populated with an invalid index value. After the desired interval expires, the point PT_0 shifts to the next entry, for example, from entry 0 to entry 1.

For purposes of discussion only, FIG. 5B shows that the table TS was populated with the index 125 at power on. No data was recorded as the pointer PT_0 was shifted from entry 0 to 5. Then, during the next desired interval, 6 program units (e.g., 6 pages or word lines) of data were recorded. As shown in FIG. 4C, data is recorded from bottom to top, and the indexes are assigned in decreasing order. Accordingly, after programming the 6 program units, the index of the last programmed unit is 119. This index is recorded in entry 6 and the pointer PT_0 is shifted to 6. Subsequently, during the next desired interval, 4 more program units are programmed, and the index of the last program unit, which is 115, is recorded in entry 7, and the pointer PT_0 records entry 7. Then, during the next desired interval, 5 more program units are programmed, and the index of the last program unit, which is 110, is recorded in entry 8, and the pointer PT_0 records entry 8. If no data is recorded during the next desired interval, the pointer PT_0 is updated to 9. Because entry 9 stores a value, for example 125, that is greater than the preceding entry, this indicates that the index 125 is invalid. Alternatively, if the entry 9 stored the invalid value discussed above, this would also indicate the entry is invalid.

In this manner, time that has elapsed since recording the program units may be determined. For example, the program unit corresponding to index 110 has an elapsed time of 0, while the program unit corresponding to index 115 has an elapsed time of, for example, 0.01 second since programming assuming the desired interval is 0.01 seconds. And, according to this example, the program unit corresponding to index 119 has a program lapse time of 0.02 seconds. As will be appreciated if the same index appears in two or more consecutive entries, the entries are invalid. Accordingly, based on the entry to which the pointer PT_0 is pointing, the program lapse time (as referred to as the elapsed time) associated with each index in the table TS may be determined.

Each elapsed time (e.g., 0 sec, 0.01 sec, 0.02 sec, etc.) has a read condition (e.g., read voltage and/or sensing condition) associated therewith. Accordingly, as will be discussed in detail below, assuming the elapsed time since programming a read requested memory area is less than the stabilization time t1, by determining the elapsed time associated with a read requested memory area using the tables above, the read condition for improving read performance of the read requested memory area may be obtained.

FIG. 6 illustrates a data structure for managing the relationship between elapsed time and the indexes of the program units according to another example embodiment. In this embodiment, the data structure includes a plurality of sub time stamp tables as the time stamp table, and each sub time stamp table has an associated zero pointer. For example, the embodiment of FIG. 6 includes first through fourth sub time stamp tables TS_1, TS_2, TS_3 and TS_4 and first through fourth zero pointers PT1_0, PT2_0, PT3_0 and PT4_0.

Each sub time stamp table is associated with a different time interval and time zone. In one embodiment, the sub time stamp tables may have a log scale relationship. For example, the first sub time stamp table TS_1 may represent the time zone of 0 to 0.1 seconds and each entry represents a 0.01 second interval; the second sub time stamp table TS_2 may represent the time zone of 0.1 to 1.0 seconds and each entry represents a 0.1 second interval; the third sub time stamp table TS_3 may represent the time zone of 1.0 to 10.0 seconds and each entry represents a 1 second interval; and the fourth sub time stamp table TS_4 may represent the time zone of 10 to 100 seconds and each entry represents a 10 second interval. The management of the sub time stamp tables and pointers is the same as described above with respect to FIG. 5B, albeit allotting for changes in the time intervals. Accordingly, as will be appreciated, when an index is in an entry corresponding to 0.09 seconds of the first sub time stamp table TS_1, after the next 0.01 second interval, that index is moved to the 0.1 second entry pointed to by the zero pointer PT_2 of the second sub time stamp table TS_2. In the same manner, after the next 0.1 second interval, the entry corresponding to 0.9 second entry of the second sub time stamp table TS_2 is moved to the 1.0 second entry pointed to by the zero pointer PT_3 of the third sub time stamp table TS_3; and after the next 1 second interval, the entry corresponding to the 9 second entry of the third sub time stamp table TS_3 is moved to the 10.0 second entry pointed to by the zero pointer PT_4 of the fourth sub time stamp table TS_4.

The time stamp table TS may be used to determine whether a memory block in a read requested memory area (e.g., formed of one or more program units) is a memory block programmed within the stabilization time t1. That is, it is possible to determine whether a memory block in a read requested memory area has program units included in the time stamp table TS. If so, this may mean that a read condition (e.g., a read voltage between read voltages VR1 and VR2 shown in FIG. 3) is changed. On the contrary, if not included, this may mean that a program lapse time of the read requested memory area exceeds the stabilization time t1. That is, a memory area may be accessed using a default read condition (e.g., a read voltage VR2 shown in FIG. 3).

Figure 7:
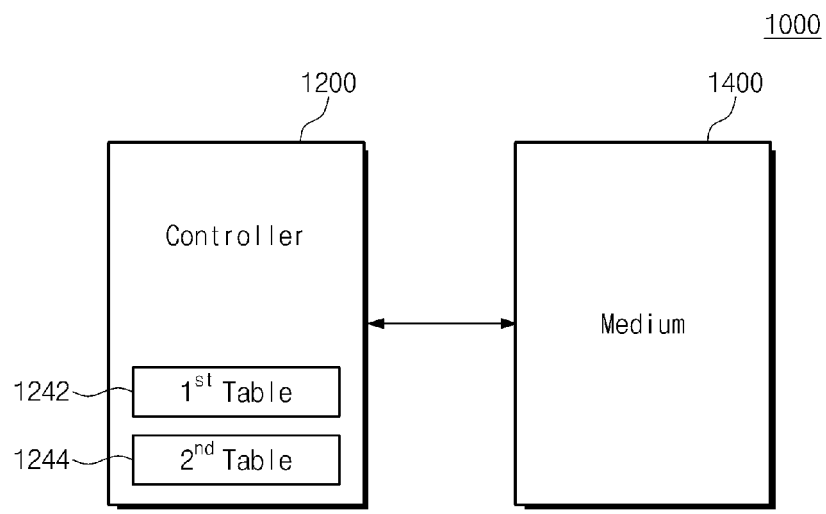
FIG. 7 is a block diagram schematically illustrating a memory system according to an embodiment of the inventive concepts.

FIG. 7 is a block diagram schematically illustrating a memory system according to an embodiment of the inventive concepts.

Referring to FIG. 7, a memory system according to an embodiment of the inventive concepts includes a memory controller 1200 and storage medium 1400 formed of a multi-bit/multi-level nonvolatile memory device. The memory controller 1200 may be configured to control the storage medium 1400 according to an external request (e.g., a write request, a read request, program lapse time managing and searching operations, and so on). The memory controller 1200 may be configured to control the storage medium 1400 according to an internal request (e.g., an operation associated with sudden power-off, a wear-leveling operation, a read reclaim operation, and so on) without an external request. The storage medium 1400 operates in response to a control of the memory controller 1200 and is used to store data information. The storage medium 1400 may be formed of one or more memory chips. The storage medium 1400 and the memory controller 1200 may communicate with each other through one or more channels. The storage medium 1400 may include a NAND flash memory device, for example. It is understood that a memory device used to implement the storage medium 1400 is not limited to the NAND flash memory device. In particular, a memory device used to implement the storage medium 1400 is formed of CTF cells.

The memory controller 1200 includes a first table 1242 and a second table 1244. The first table 1242 is the program order table PO described with reference to FIG. 5A, and the second table 1244 is a time stamp table or tables TS described with reference to FIG. 5B or 6. The memory controller 1200 further includes the pointers associated with these tables as described above.

When a new memory block is allocated, the memory controller 1200 manages the first table 1242 to include a block address of a newly allocated memory block as described with reference to FIGS. 4C and 5A. If a write requested memory area is programmed, the memory controller 1200 manages the second table 1244, that is, a time stamp table TS such that a time pointer (e.g., PT_0) is allocated to a program unit(s) corresponding to a program completed memory area, as described with reference to FIG. 5B or 6.

When a read request is received, the memory controller 1200 determines whether the first table 1242 includes program order information of a read requested memory area. As a consequence of determining that the first table 1242 includes program order information of the read requested memory area, the memory controller 1200 determines an index value corresponding to the read requested memory area, and determines an estimated elapsed time corresponding to the determined index value. The memory controller 1200 controls the storage medium 1400 such that a read operation is performed according to a read condition corresponding to the estimated elapsed time. For example, the memory controller 1200 may inform the storage medium 1400 of the read condition using a command, an address, data, a specific pin, etc. As a consequence of determining that the first table 1242 does not include information of the read requested memory area, the memory controller 1200 controls the storage medium 1400 such that a read operation is carried out according to a default read condition (e.g., a read condition corresponding to a threshold voltage distribution 22 shown in FIG. 2). Here, the memory controller 1200 determines the elapsed time since the memory area was last programmed is greater than the stabilization time t1.

In example embodiments, the memory controller 1200 and the nonvolatile memory device 1400 may constitute a multi-media card (MMC) or an embedded MMC (eMMC) that is directly mounted on a board of a portable electronic device. However, the inventive concept is not limited thereto.

Figure 8:
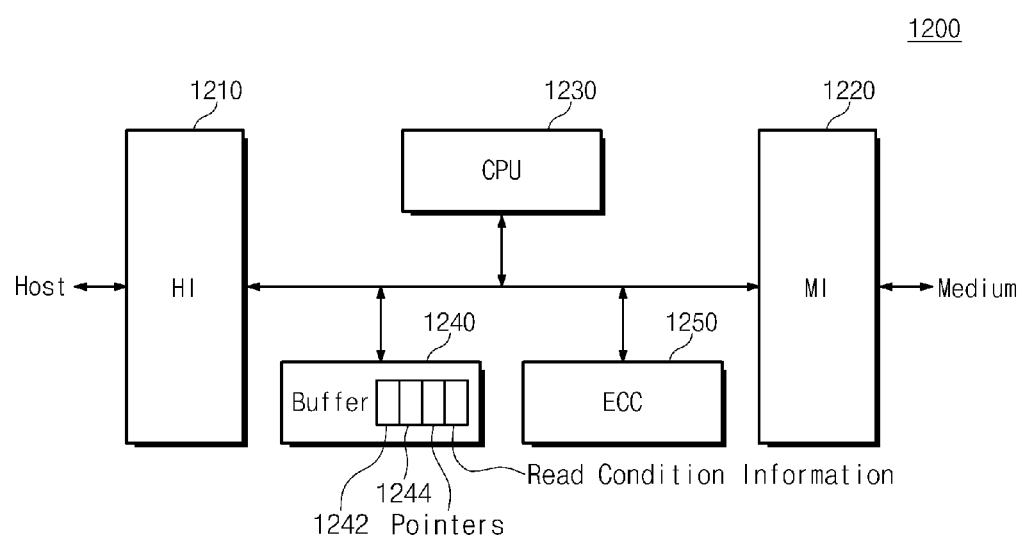
FIG. 8 is a block diagram schematically illustrating a memory controller shown in FIG. 2, according to an embodiment of the inventive concepts.

FIG. 8 is a block diagram schematically illustrating a memory controller shown in FIG. 7, according to an embodiment of the inventive concepts. Referring to FIG. 8, a memory controller 1200 includes a host interface 1210 as a first interface, a memory interface 1220 as a second interface, a central processing unit (CPU) 1230, a buffer memory 1240, and an error detecting and correcting circuit 1250.

The host interface 1210 is configured to interface with an external device (for example, a host), and the memory interface 1220 is configured to interface with storage medium 1400 illustrated in FIG. 7. The CPU 1230 is configured to control an overall operation of the controller 1200. The CPU 1230 may be configured to operate firmware such as Flash Translation Layer (FTL), for example. The FTL may perform a variety of functions. For example, the FTL may include a variety of layers performing operations of managing and searching a program lapse time, an address mapping operation, a read reclaim operation, an error correction operation, and so on. For example, the FTL populates and updates the tables 1242 and 1244 as well as the associated pointers. The FTL determines whether information of a read requested memory area is included in a first table 1242 and decides a read condition of the read requested memory area using the second table 1244 based on the determination result. The read condition thus decided may be transferred to the storage medium 1400 through the memory interface 1220.

The buffer memory 1240 may be used to temporarily store data to be transferred from an external device via the host interface 1210 or data to be transferred from the storage medium 1400 via the memory interface 1220. The buffer memory 1240 is used to store information (e.g., address mapping table and so on) to control the storage medium 1400. The buffer memory 1240 may be formed of DRAM, SRAM, or a combination of DRAM and SRAM. However, the use of the buffer memory 1400 according to the inventive concepts are not limited thereto. The buffer memory 1400 includes the first and second tables 1242 and 1244 and may include the associated pointers. However, it is understood that the inventive concepts are not limited to such a case that the first and second tables 1242 and 1244 and associated read condition information are stored in the buffer memory 1240. Furthermore, the buffer memory 1240 stores the read condition associated with each program lapse time as represented by the entries of the second table 1242 as well as the default read condition. As will be appreciated, alternatively, the CPU 1230 may store the pointers in resident cache memory. For example, the first and second tables 1242 and 1244 and associated read condition information may be managed using a separate memory. The first and second tables 1242 and 1244 and the read condition information are backed up in the storage medium 1400. The ECC 1250 may be configured to encode data to be stored in the storage medium 1400 and to decode data read out from the storage medium 1400.

Although not illustrated in the figures, the memory controller 1200 may further include a randomizer/de-randomizer, which is configured to randomize data to be stored in the nonvolatile memory device 1400 and to de-randomize data read from the nonvolatile memory device 1400. An example of the randomizer/de-randomizer is disclosed in U.S. Patent Publication No. 2010/0088574, the entire contents of which are hereby incorporated by reference.

In example embodiments, the host interface 1210 may be formed of one of computer bus standards, storage bus standards, iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, and the like. The storage bus standards may include ST-506, ESDI, SMD, Parallel ATA, DMA, SSA, HIPPI, USB MSC, FireWire (1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, and the like.

Figure 9:
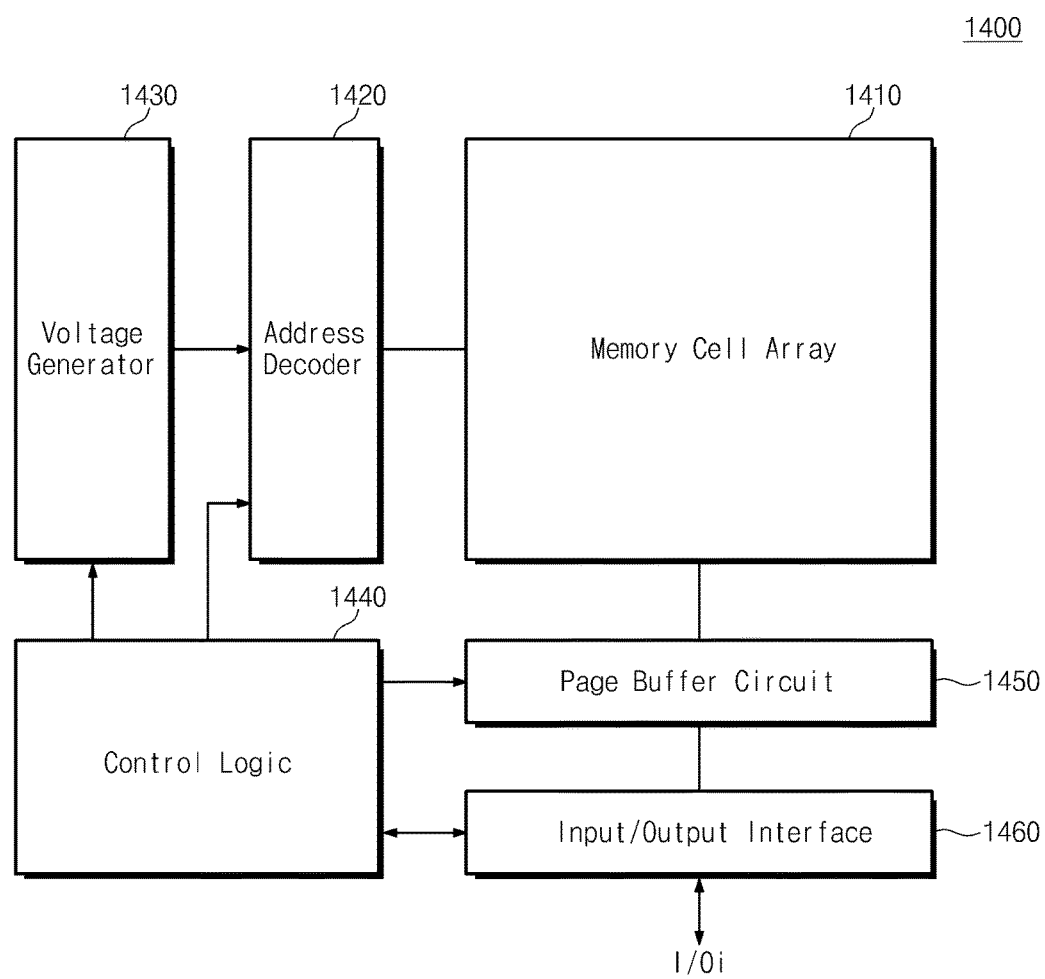
FIG. 9 is a block diagram schematically illustrating storage medium shown in FIG. 7, according to an embodiment of the inventive concepts.

FIG. 9 is a block diagram schematically illustrating storage medium shown in FIG. 7, according to an embodiment of the inventive concepts.

Storage medium 1400 may be a NAND flash memory device, for example. However, it is well understood that the storage medium 1400 is not limited to the NAND flash memory device. In particular, memory cells included in the storage medium 1400 may be CTF cells. Also, the storage medium 1400 of the inventive concepts may be implemented to have a three-dimensional array structure. A non-volatile memory device with the three-dimensional array structure may be referred to as a vertical NAND (VNAND) flash memory device. Examples of the vertical NAND flash memory device are disclosed in U.S. Patent Publication Nos. 2013/0017629 and 2013/0051146, the entire contents of which are hereby incorporated by reference.

Referring to FIG. 9, the storage medium 1400 includes a memory cell array 1410, an address decoder 1420, a voltage generator 1430, control logic 1440, a page buffer circuit 1450, and an input and output interface 1460.

The memory cell array 1410 may include memory cells arranged at intersections of rows (e.g., word lines) and columns (e.g., bit lines). Each memory cell may store 1-bit data or M-bit data as multi-bit data (M being an integer of 2 or more). The address decoder 1420 is controlled by the control logic 1440, and performs selecting and driving operations about rows (e.g., word lines, a string selection line(s), a ground selection line(s), a common source line, etc.) of the memory cell array 1410. The voltage generator 1430 is controlled by the control logic 1440, and generates voltages required for each operation such as a high voltage, a program voltage, a read voltage, a verification voltage, an erase voltage, a pass voltage, a bulk voltage, and the like. Voltages generated by the voltage generator 1430 may be provided to the memory cell array 1410 via the address decoder 1420. The control logic 1440 is configured to control an overall operation of the storage medium 1400.

The page buffer circuit 1450 is controlled by the control logic 1440, and is configured to read data from the memory cell array 1410 and to drive columns (e.g., bit lines) of the memory cell array 1410 according to program data. The page buffer circuit 1450 may include page buffers respectively corresponding to bit lines or bit line pairs. Each of the page buffers may include a plurality of latches. The input and output interface 1460 is controlled by the control logic 1440, and interfaces with an external device (e.g., a memory controller 1200 shown in FIG. 6). Although not illustrated in FIG. 9, the input and output interface 1460 may include a column decoder configured to select page buffers of the page buffer circuit 1450 by a desired (or, alternatively a predetermined) unit, an input buffer configured to receive data, an output buffer configured to output data, and so on.

The control logic 1440 performs a read operation according to a read condition from the memory controller 1200. The read condition may be provided from the memory controller 1200 using a command, an address, data, a specific input/output pin(s), etc. The control logic 1440 controls the voltage generator 1430 to change a read voltage to be provided to a read requested memory area, for example. As illustrated in FIG. 3, the read voltage may be changed, for example, between a read voltage VR1 corresponding to a threshold voltage distribution 21 formed immediately after a program operation is completed and a read voltage VR2 corresponding to a threshold voltage distribution 22 formed after a stabilization time t1 elapses. Alternatively, the control logic 1440 may control the page buffer circuit 1450 to change at least one of sensing conditions such as a bit line develop time, a bit line pre-charge time, a sensing margin (e.g., a relationship between a bit line pre-charge voltage and a bit line shut-off voltage), and so on. A change in sensing condition may be viewed as a variation in read voltage. The read conditions are not limited to this disclosure.

Figure 10:
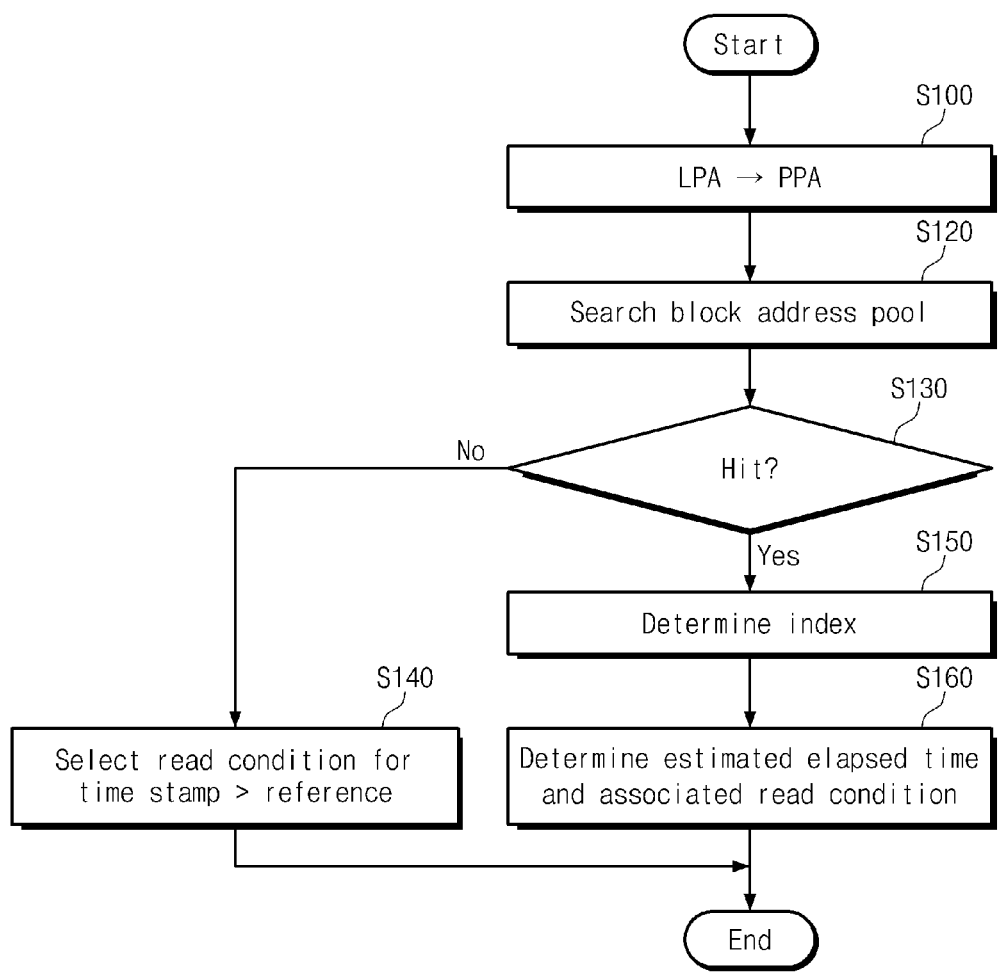
FIG. 10 is a flow chart schematically illustrating a program lapse time searching method of a memory controller according to an embodiment of the inventive concepts.

FIG. 10 is a flow chart schematically illustrating a program lapse time searching method of a memory controller according to an embodiment of the inventive concepts.

Referring to FIG. 10, in step S100, a memory controller 1200 performs an address translation operation. For example, the memory controller 1200 translates a logical address LPA provided with a read request into a physical address PPA. In step S120, the memory controller 1200 searches whether block address information of the physical address PPA is included in a block address pool. For example, the memory controller 1200 searches whether a first table 1242 includes block address information of a read requested memory block. That the block address information of the read requested memory block is equal to one of block addresses stored in the first table 1242, a program order table PO, may mean that a program lapse time of the read requested memory area does not exceed a stabilization time t1. On the contrary, that the block address information of the read requested memory block is not equal to one of block addresses stored in the first table 1242, a program order table PO, may mean that a program lapse time of the read requested memory area exceeds the stabilization time t1.

In an example embodiment, the search operation may be performed under a condition where block addresses stored in the first table 1242 are sorted for binary search.

In step S130, the memory controller 1200 determines whether the search result indicates "Hit". If the search result indicates "Not Hit", this indicates the table 1242 does not include program order information for the read requested memory block, and the method proceeds to step S140, in which the memory controller 1400 decides that a program lapse time (or, referred to as "time stamp") of the read requested memory block exceeds a reference, for example, the stabilization time t1. In the event that a program lapse time of a read requested memory block exceeds a reference, that is, the stabilization time t1, the memory controller 1200 controls storage medium 1400 to perform a read operation according to a default read condition (e.g., a condition in which a read operation is performed using a read voltage VR2 shown in FIG. 2).

If the search result indicates "Hit", this indicates that program order information exists in the table 1242 for the read requested memory block and the method proceeds to step S150, in which the memory controller 1400 determines an index value corresponding to the read request. For example, the memory controller 1400 obtains program order information from the first table 1242 using the pointer PT_BLK and the block address information for the read requested memory block. The programming order information indicates an order in which the read requested memory block was programmed. For example, if the first table 1242 and the pointer PT_BLK are in the state shown in FIG. 5A and the block address of the read requested memory area is 257, then the memory controller 1400 determines the program order of the read requested memory area as two (i.e., the second youngest programmed memory block). As such the index of the program units in this memory block will be from 2N to N+1 as shown in FIG. 4C. The program unit address (e.g., wordline or page address) of the physical address PPA indicates the program unit in the read requested memory block, and therefore indicates which index to select. Using the example of FIG. 5A, the program unit address indicates one of the indexes between 2N to N+1, inclusive.

Next, in step S160, the memory controller 1200 determines an estimated elapsed time for the read requested program unit. The estimated elapsed time indicates a time that has elapsed since the read requested program unit was last programmed. Here, the memory controller 1200 accesses the second table 1244 (i.e., the time stamp table TS) using the determined index to obtain elapsed time information. In one embodiment, the elapsed time information indicates the elapsed time associated with the index in the second table 1244 that is (1) closest to the determined index and (2) less than or equal to the determined index. For example, if the determined index was 116, then with respect to the example time stamp table TS shown in FIG. 5B, the elapsed time information would indicate the elapsed time associated with index 115. And, assuming each entry represents an interval of 0.01 seconds, and the zero pointer PT_0 is as shown in FIG. 5B, then the elapsed time information would be 0.01 seconds. In another embodiment, the elapsed time information is the elapsed time associated with the index in the second table 1244 that is (1) closest to the determined index and (2) greater than or equal to the determined index. For example, if the determined index was 116, then with respect to the example time stamp table TS shown in FIG. 5B, the elapsed time information would indicate the elapsed time associated with index 119. And, assuming each entry represents an interval of 0.01 seconds, and the zero pointer PT_0 is as shown in FIG. 5B, then the elapsed time information would be 0.02 seconds. In these embodiments, the estimate elapsed time may be the elapsed time indicated by the elapsed time information.

As discussed previously, the memory controller 1200 stores a read condition associated with each elapsed time. Accordingly, the memory controller 1200 controls the storage medium 1400 to perform the read operation according the read condition for the estimated elapsed time. Here, for example, the read condition corresponding to the estimated elapsed time may be a read voltage between VR1 and VR2 shown in FIG. 3. The read conditions may be design parameters determined through empirical study.

In yet another embodiment, the elapsed time information may a first elapsed time and a second elapsed time. The first elapsed time is associated with the index that is (1) closest to the determined index and (2) less than or equal to the determined index, and the second elapsed time is associated with the index that is (1) closest to the determined index and (2) greater than or equal to the determined index. Using the example above, the first elapsed time would be 0.01 seconds and the second elapsed time would be 0.02 second. Here, the memory controller 1200 may select one of the first and second elapsed times as the estimated elapsed time, may average the first and second elapsed times to obtain the estimated elapsed time, may interpolate between the first and second elapsed times based on the associated indexes and the determined index to obtain the estimated elapsed time, etc. Alternatively, the memory controller 1200 may treat both the first and second elapsed times as estimated elapsed times, and obtain the read condition for each elapsed time. The memory controller 1200 may then average the read conditions, or may interpolate between the read conditions based on the associated indexes and the determined index, to obtain the read condition for performing the read operation.

Next, another embodiment of managing the relationship between the indexes and the elapsed times will be described.

Figure 11:
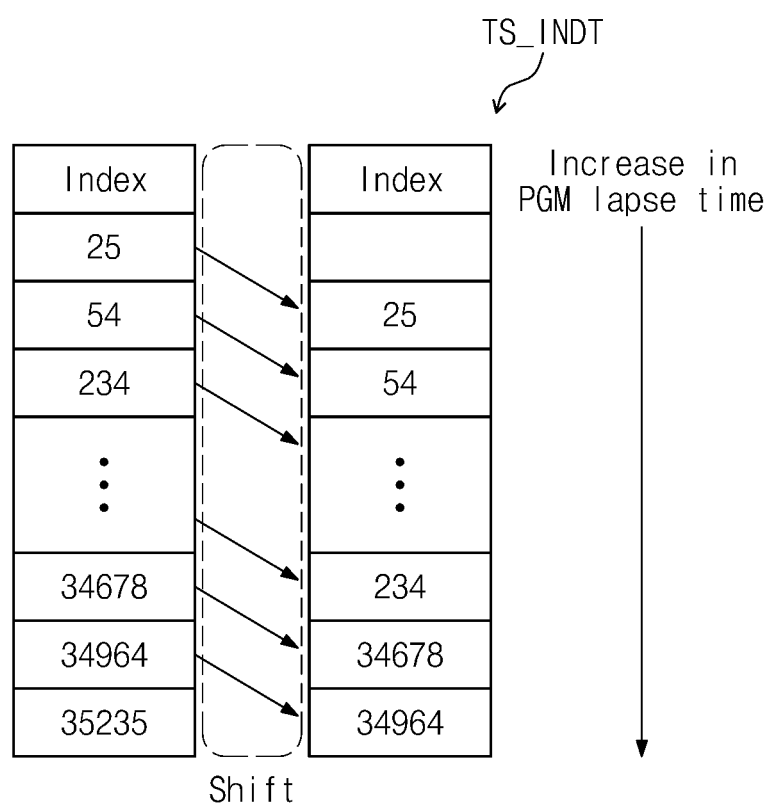
FIG. 11 illustrates an index table for managing elapsed time according to another embodiment.

In this embodiment, instead of using a time stamp table TS and zero pointer PT_0, an index table TS_INDT as shown in FIG. 11 is used. Here, each entry in the index table TS_INDT corresponds to a particular elapsed time. For example, the top entry corresponds to time 0 seconds, the second from the top entry corresponds to time 0.01 seconds, the third from the top entry corresponds to time 0.02 seconds, etc. As will be understood, 0.01 seconds is the desired time interval in this example, but embodiments are not limited to this desired time interval. In this embodiment, the memory controller 1200 shifts the indexes stored in the entries down after each desired interval expires, and enters any new index resulting from a program operation into the top entry. The method of controlling the read condition using this embodiment is the same as described above with respect to FIG. 10 except that each entry of the index table directly corresponds to an elapsed time. As will be appreciated, the number of entries in the index table TS_INDT may be sufficient for the final entry to equal or exceed the stabilization time t1.

Still further, instead of a single index table with a single desired time interval, a plurality of sub index tables, each associated with a different desired time interval may be used. For example, the different sub index tables may have a log relationship in the same manner as the time stamp tables described above with respect to FIG. 6.

Figure 12:
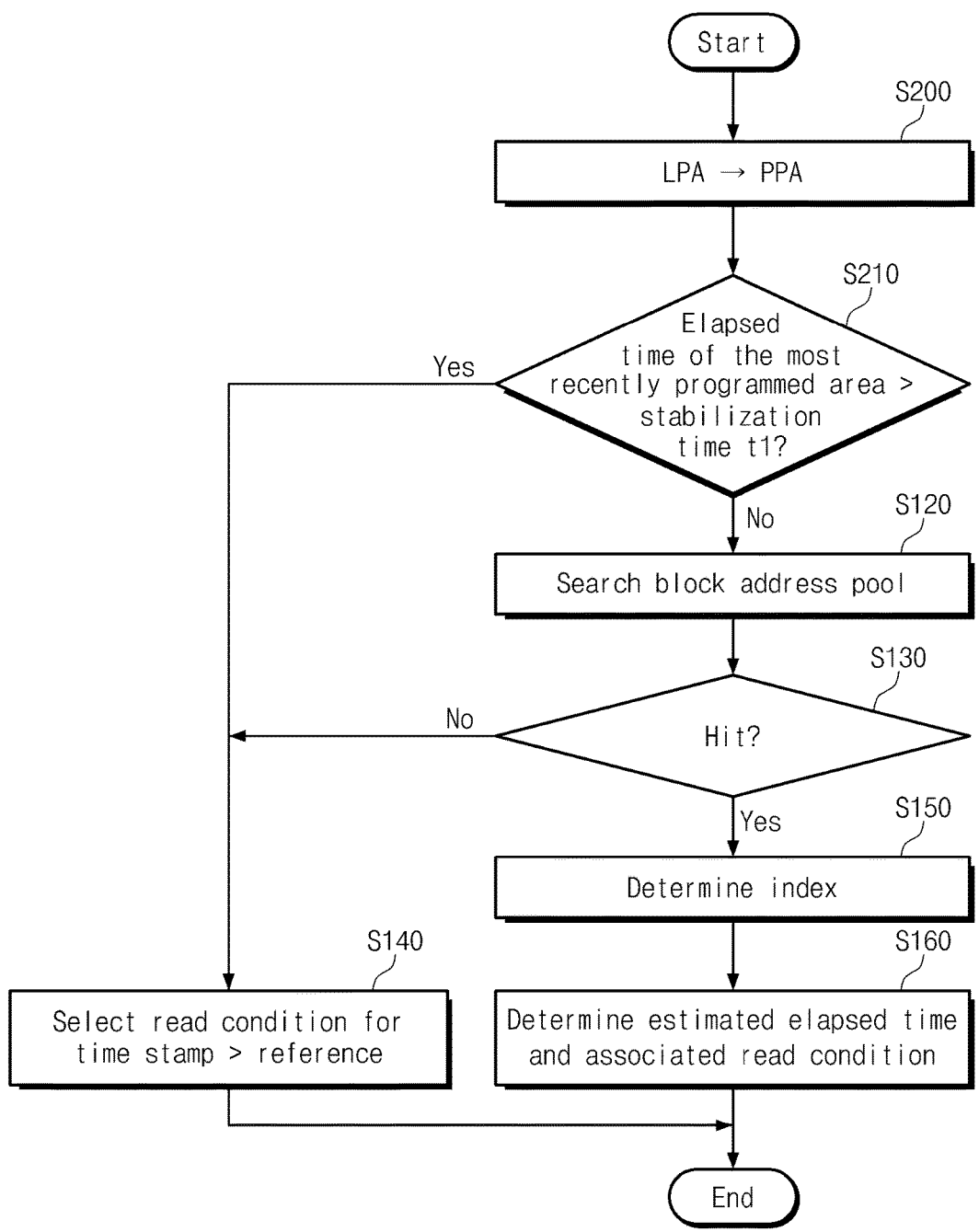
FIG. 12 is a flow chart schematically illustrating a program lapse time searching method of a memory controller according to another embodiment of the inventive concepts.

FIG. 12 is a flow chart schematically illustrating a program lapse time searching method of a memory controller according to another embodiment of the inventive concepts.

Referring to FIG. 12, in step S200, a memory controller 1200 performs an address translation operation. For example, the memory controller 1200 translates a logical address LPA provided with a read request into a physical address PPA. In step S210, the memory controller 1200 determines whether the elapsed time corresponding to the most recently programmed program unit exceeds the stabilization time t1. If the elapsed time of the most recently programmed program unit exceeds the stabilization time t1 then the program lapse times of programmed memory blocks stored in the first table 1242 exceed the stabilization time t1. As a consequence, the method proceeds to step S140. On the contrary, as a consequence of determining that the elapsed time of the most recently programmed program unit does not exceed stabilization time t1, processing proceeds to step S120. Steps 120-160 are the same as described above with respect to FIG. 10 and will not be repeated for the sake of brevity.

Figure 13:
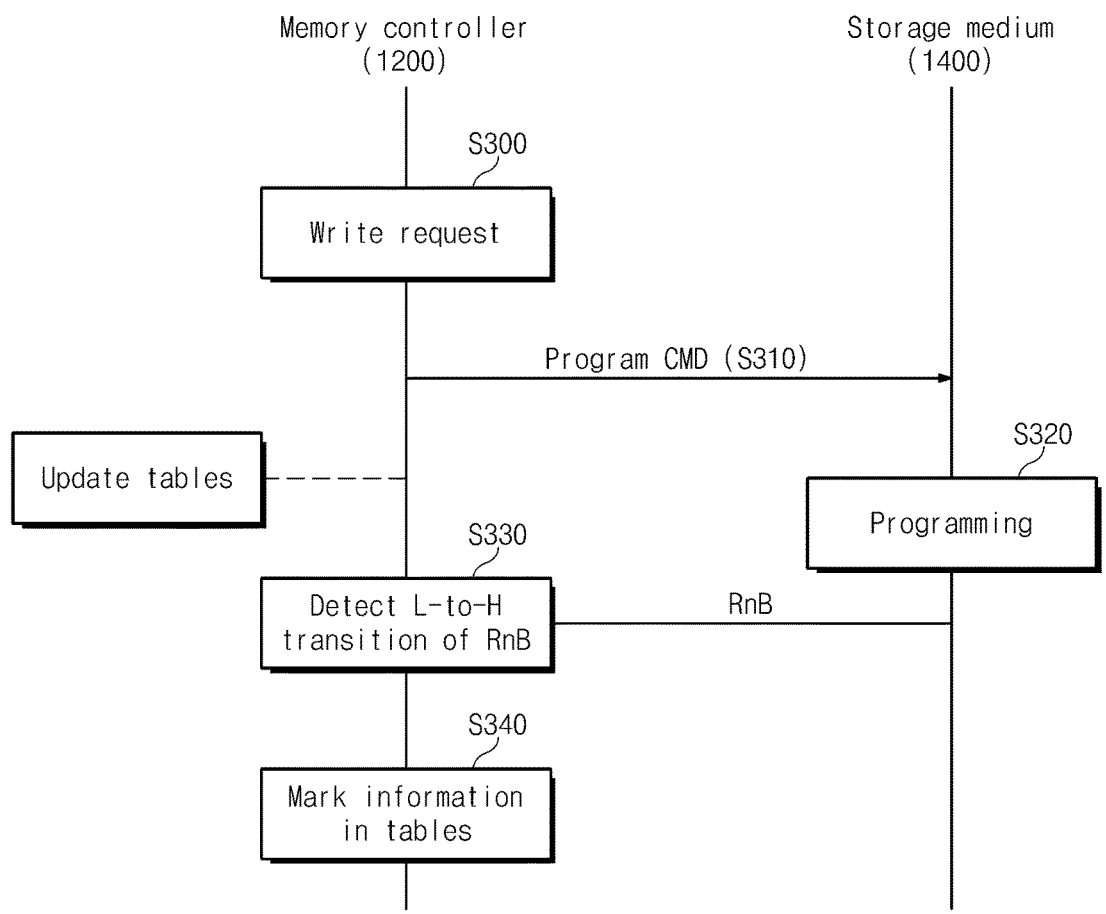
FIG. 13 is a diagram schematically illustrating a write flow of a memory system according to an embodiment of the inventive concepts.

FIG. 13 is a diagram schematically illustrating a write flow of a memory system according to an embodiment of the inventive concepts.

Referring to FIG. 13, in step S300, a memory controller 1200 receives a write request from an external device (e.g., a host to which a memory system 1000 is connected). In step S310, the memory controller 1200 issues a program command to storage medium 1400. Here, the program command may be transferred to the storage medium 1400 together with an address for appointing a write requested memory area. In step S320, the storage medium 1400 stores write requested data in the write requested memory area. After a program operation commences, in step S330, the memory controller 1200 monitors whether the program operation of the storage medium 1400 is ended. Here, whether the program operation of the storage medium 1400 is ended may be determined by detecting a transition (e.g., a low-to-high transition) of a signal (e.g., a signal on an RnB line) output from the storage medium 1400. If a low-to-high transition of the signal (e.g., an RnB signal) from the storage medium

1400 is detected, in step S430, the block address associated with the programmed memory area is added to the program order table PO (if not the most recent entry already), and the index for the most recent programmed program unit is determined and added to the time stamp table TS.

In exemplary embodiments, the memory controller may manage the first and second tables 1242 to 1244 during the write flow. The first and second tables 1242 to 1244 may also be managed during a background operation.

Figure 14:
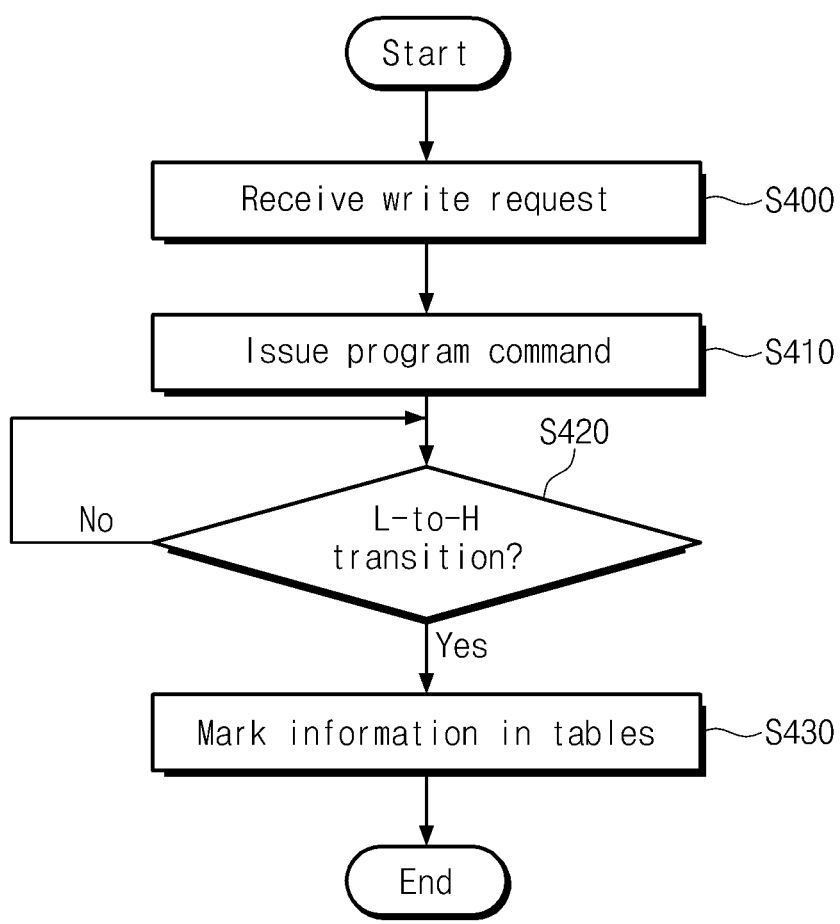
FIG. 14 is a flow chart schematically illustrating a program control method of a memory controller according to an embodiment of the inventive concepts.

FIG. 14 is a flow chart schematically illustrating a program control method of a memory controller according to an embodiment of the inventive concepts.

Referring to FIG. 14, a program control method of a memory controller 1200 according to an embodiment of the inventive concept includes issuing a program command (S410); detecting whether a signal line (e.g., RnB) of storage medium 1400 transitions from a low level to a high level (S420); and recording program order and index information corresponding to a write requested memory area in the first and second tables 1241 and 1244, respectively when the signal line (e.g., RnB) of the storage medium 1400 transitions from a low level to a high level (S430). Here, when the signal line (e.g., RnB) of the storage medium 1400 does not transition from a low level to a high level, the memory controller 1200 performs an operation corresponding to step S420. The program command may be transmitted together with an address and write requested data.

In example embodiments, during a background operation, the memory controller 1200 may manage first and second tables 1242 to 1244 and associated pointers.

Figure 15:
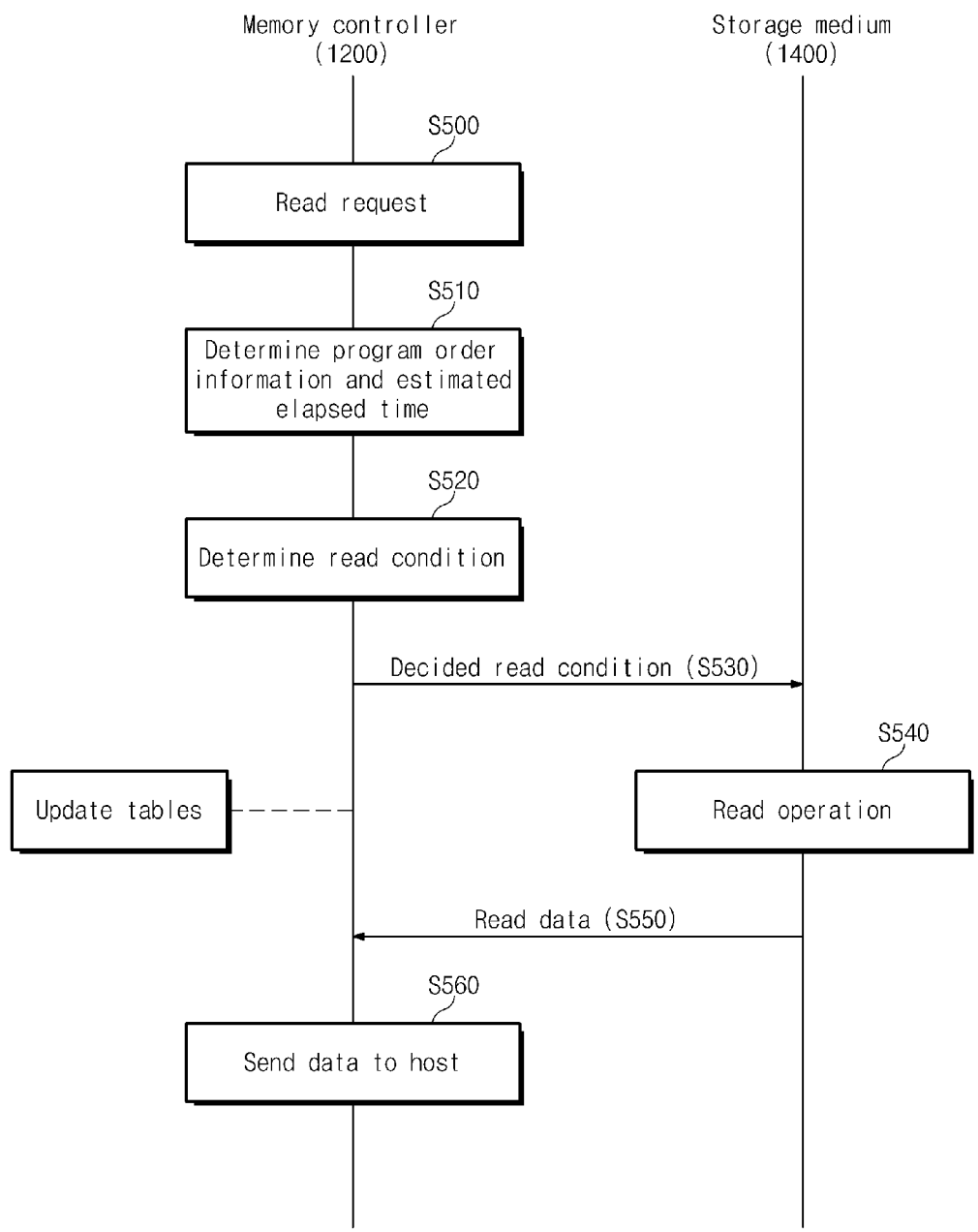
FIG. 15 is a diagram schematically illustrating a read flow of a memory system according to an embodiment of the inventive concepts.

FIG. 15 is a diagram schematically illustrating a read flow of a memory system according to an embodiment of the inventive concept.

Referring to FIG. 15, in step S500, a memory controller 1200 receives a read request from an external device (e.g., a host to which a memory system 1000 is connected). In step S510, the memory controller 1200 determines program order information and then an estimated elapsed time of a read requested memory area according to a manner described with reference to FIG. 10 or 12. In step S520, the memory controller 1200 determines a read condition based on the decision result as described with respect to FIG. 10 or 12. In step S530, the memory controller 1200 provides storage medium 1400 with the read condition thus decided. The read condition may be transmitted to the storage medium 1400 using a command, an address, data, or a specific input/output pin(s). In step S540, the storage medium 1400 performs a read operation about a read requested memory area according to the read condition provided from the memory controller 1200. In step S550, the read data is transferred to the memory controller 1200. In step S560, the memory controller 1200 provides the read data to the external device.

In example embodiments, during a background operation, the memory controller 1200 may manage first and second tables 1242 to 1244 and associated pointers.

Figure 16A:
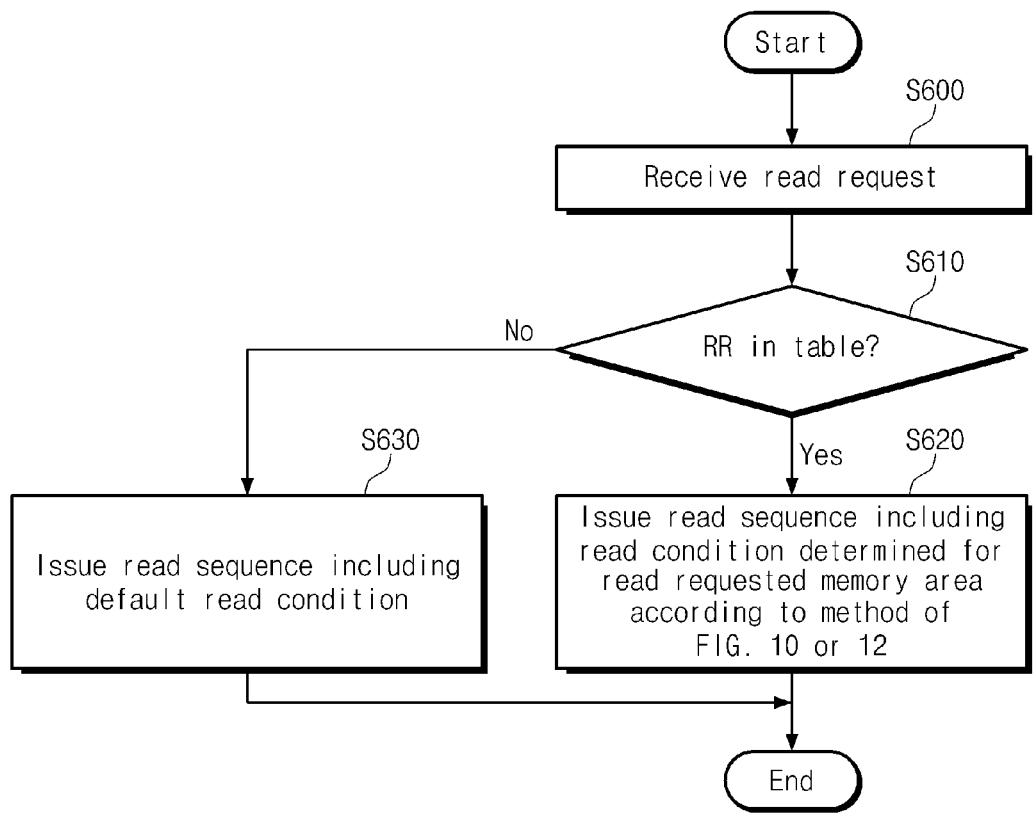
FIG. 16A is a flow chart schematically illustrating a read control method of a memory controller according to an embodiment of the inventive concepts.

FIG. 16A is a flow chart schematically illustrating a read control method of a memory controller according to an embodiment of the inventive concept.

Referring to FIG. 16A, a read control method of a memory controller according to an embodiment of the inventive concepts includes receiving a read request (S600); determining whether a first table 1242 includes information of a read requested memory area (S610); issuing a read sequence including the read condition decided based on an elapsed time determined for the read requested memory area (see FIG. 10 or FIG. 12), when the first table 1242 includes information of the read requested memory area (S620); and issuing a read sequence including a default read condition when the first table 1242 does not include information of the read requested memory area (S630). The default read condition, for example, may be a read condition where a read voltage VR2 shown in FIG. 2 is generated. In example embodiments, during a background operation, the memory controller 1200 may manage first and second tables 1242 to 1244 and associated pointers.

Figure 16B:
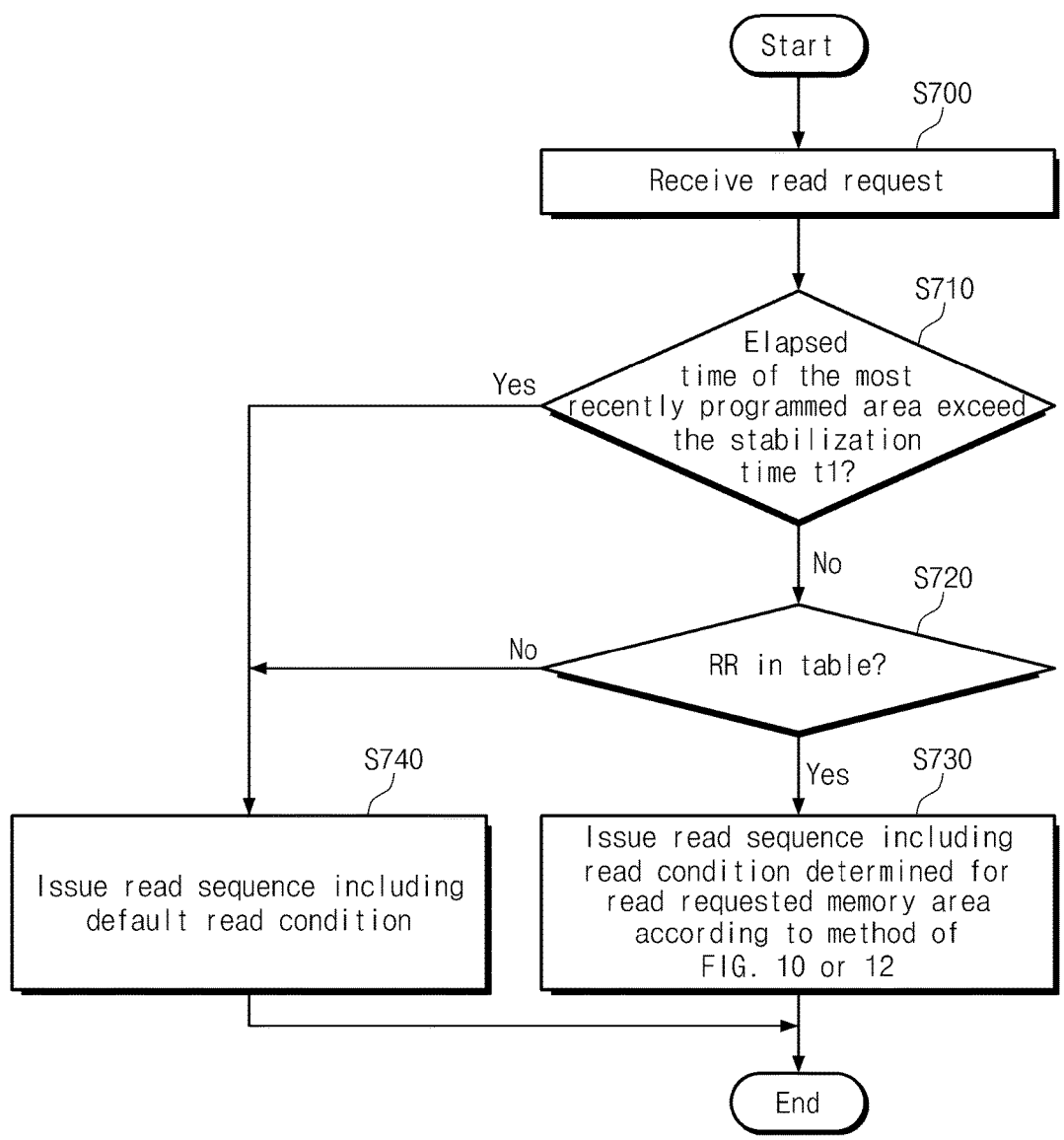
FIG. 16B is a flow chart schematically illustrating a read control method of a memory controller according to another embodiment of the inventive concepts.

FIG. 16B is a flow chart schematically illustrating a read control method of a memory controller according to another embodiment of the inventive concepts.

Referring to FIG. 16B, a read control method of a memory controller according to an embodiment of the inventive concepts includes receiving a read request (S700); determining whether an elapsed time of a most recently programmed program unit exceeds the stabilization time t1 (S710); as a consequence of determining that the elapsed time of the most recently programmed program unit does not exceed the stabilization time t1, determining whether a first table 1242 includes information of a read requested memory area (S720); issuing a read sequence including the read condition decided based on an elapsed time determined for the read requested memory area (see FIG. 10 or FIG. 12), when the first table 1242 includes information of the read requested memory area (S730); and issuing a read sequence including a default read condition when the first table 1242 does not include information of the read requested memory area or when an elapsed time of the most recently programmed program unit exceeds the stabilization time t1 (S740). The default read condition, for example, may be a read condition where a read voltage VR2 shown in FIG. 2 is generated. In example embodiments, during a background operation, the memory controller 1200 may manage first and second tables 1242 to 1244 and associated pointers.

Figure 17:
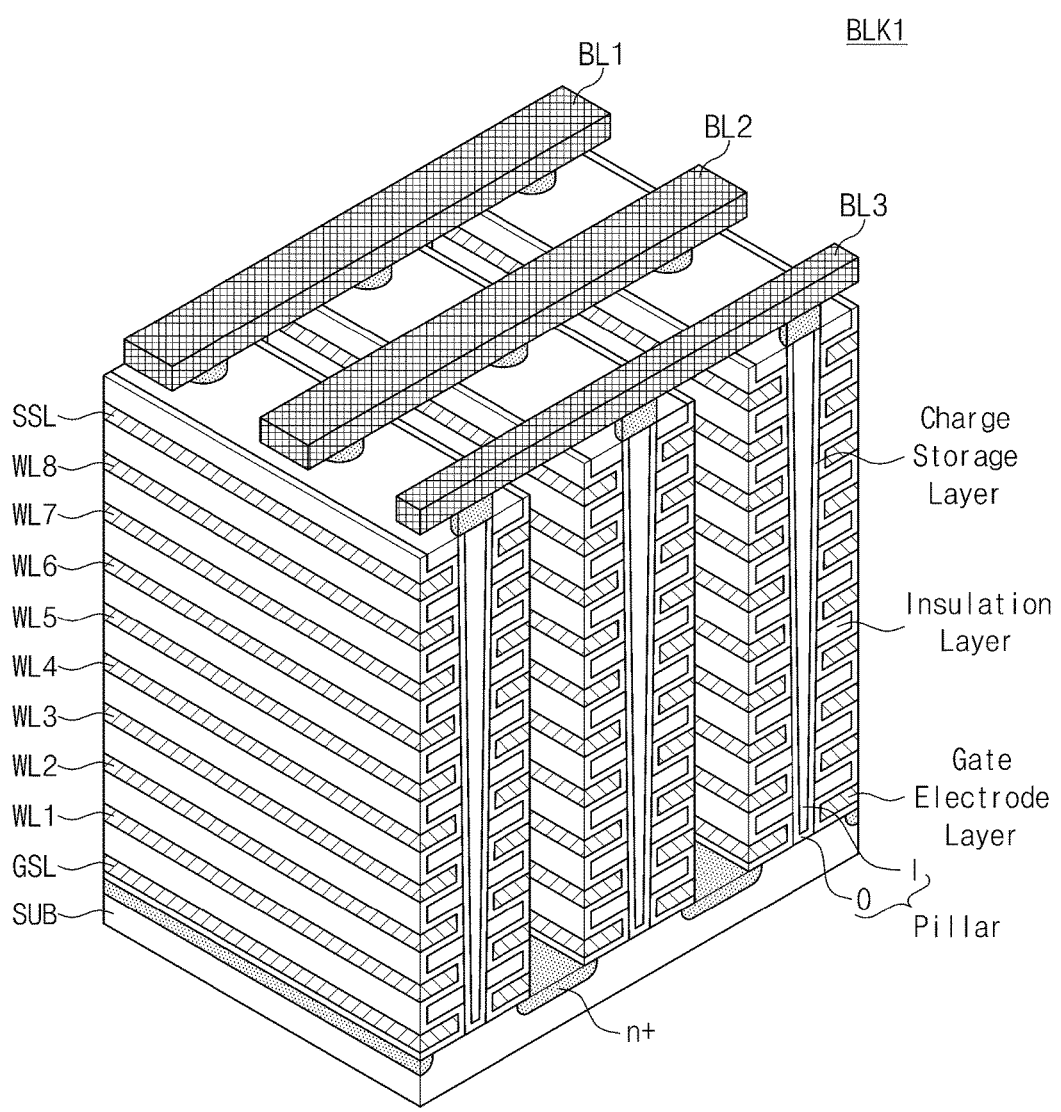
FIG. 17 is a perspective view schematically illustrating a three-dimensional structure of a memory block according to an embodiment of the inventive concepts.

FIG. 17 is a perspective view schematically illustrating a three-dimensional structure of a memory block according to an embodiment of the inventive concepts. Referring to FIG. 17, a memory block BLK1 is formed in a direction perpendicular to a substrate SUB. An n+ doping region is formed in the substrate SUB. A gate electrode layer and an insulation layer are deposited on the substrate SUB in turn. A charge storage layer is formed between the gate electrode layer and the insulation layer.

If the gate electrode layer and the insulation layer are patterned in a vertical direction, a V-shaped pillar may be formed. The pillar may be connected with the substrate SUB via the gate electrode layer and the insulation layer. An outer portion O of the pillar may be formed of a channel semiconductor, and an inner portion I thereof may be formed of an insulation material such as silicon oxide.

The gate electrode layers of the memory block BLK1 are connected to a ground selection line GSL, a plurality of word lines WL1 to WL8, and a string selection line SSL. The pillars of the memory block BLK1 may be connected to a plurality of bit lines BL1 to BL3. In FIG. 17, there is illustrated an example where one memory block BLK1 has two selection lines SSL and GSL, eight word lines WL1 to WL8, and three bit lines BL1 to BL3. However, the inventive concept is not limited thereto.

Figure 18:
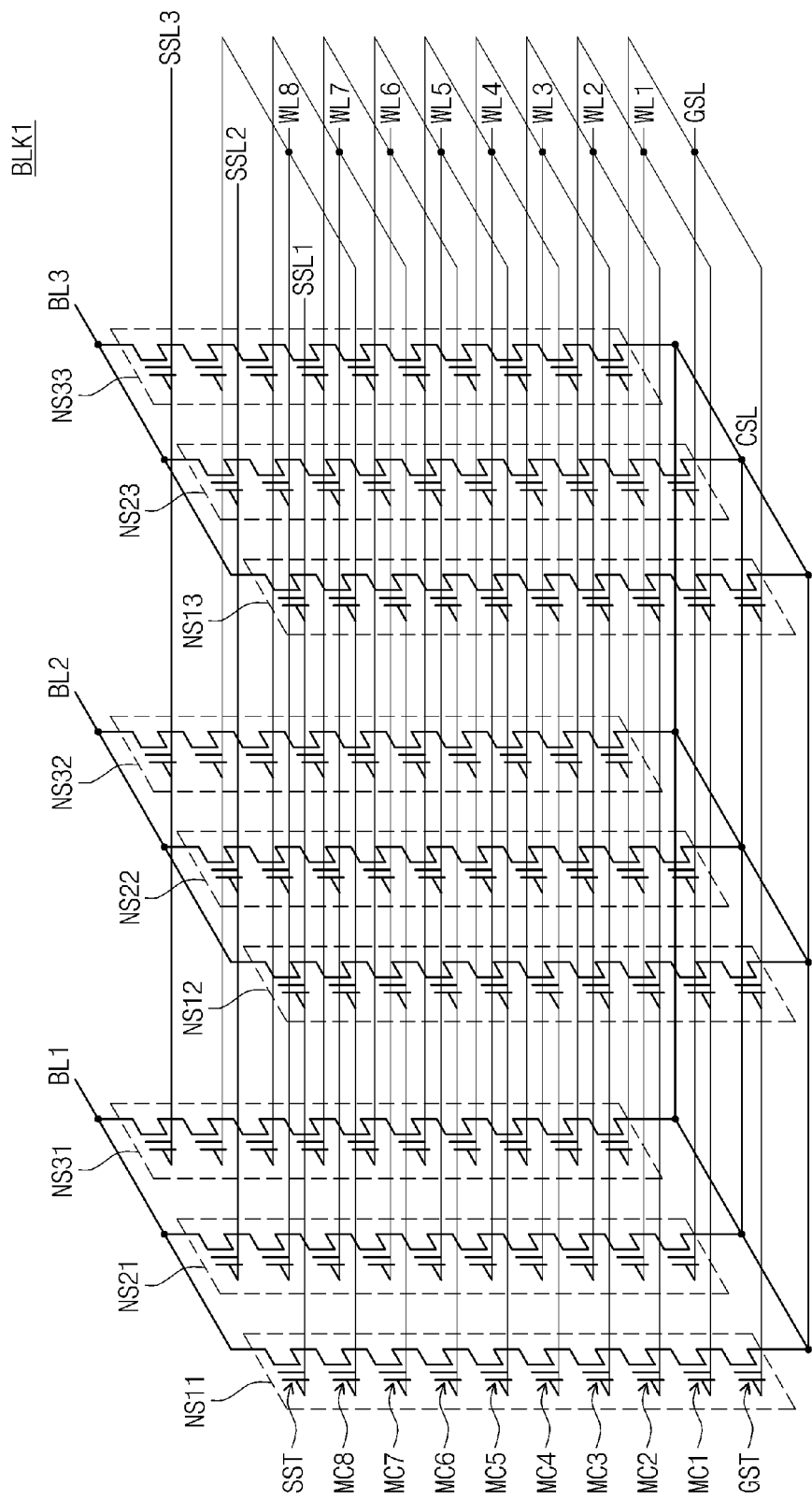
FIG. 18 is a circuit diagram schematically illustrating an equivalent circuit of a memory block illustrated in FIG. 17.

FIG. 18 is a circuit diagram schematically illustrating an equivalent circuit of a memory block illustrated in FIG. 17. Referring to FIG. 18, NAND strings NS11 to NS33 may be connected between bit lines BL1 to BL3 and a common source line CSL. Each NAND string (e.g., NS11) includes a string selection transistor SST, a plurality of memory cells MC1 to MC8, and a ground selection transistor GST.

The string selection transistors SST are connected to string selection lines SSL1 to SSL3. The memory cells MC1 to MC8 are connected to corresponding word lines WL1 to WL8, respectively. The ground selection transistors GST are connected to ground selection lines GSL1 to GSL3. In each NAND string, the string selection transistor SST may be connected to a bit line, and the ground selection transistor GST may be connected to the common source line CSL.

Word lines (e.g., WL1) having the same height may be connected in common, and the string selection lines SSL1 to SSL3 may be separated from one another. The string selection lines GSL1 to GSL3 may be connected in common. At programming of memory cells (constituting a page) connected with a first word line WL1 and included in NAND strings NS11, NS12, and NS13, there may be selected a first word line WL1 and a first string selection line SSL1.

Figure 19:
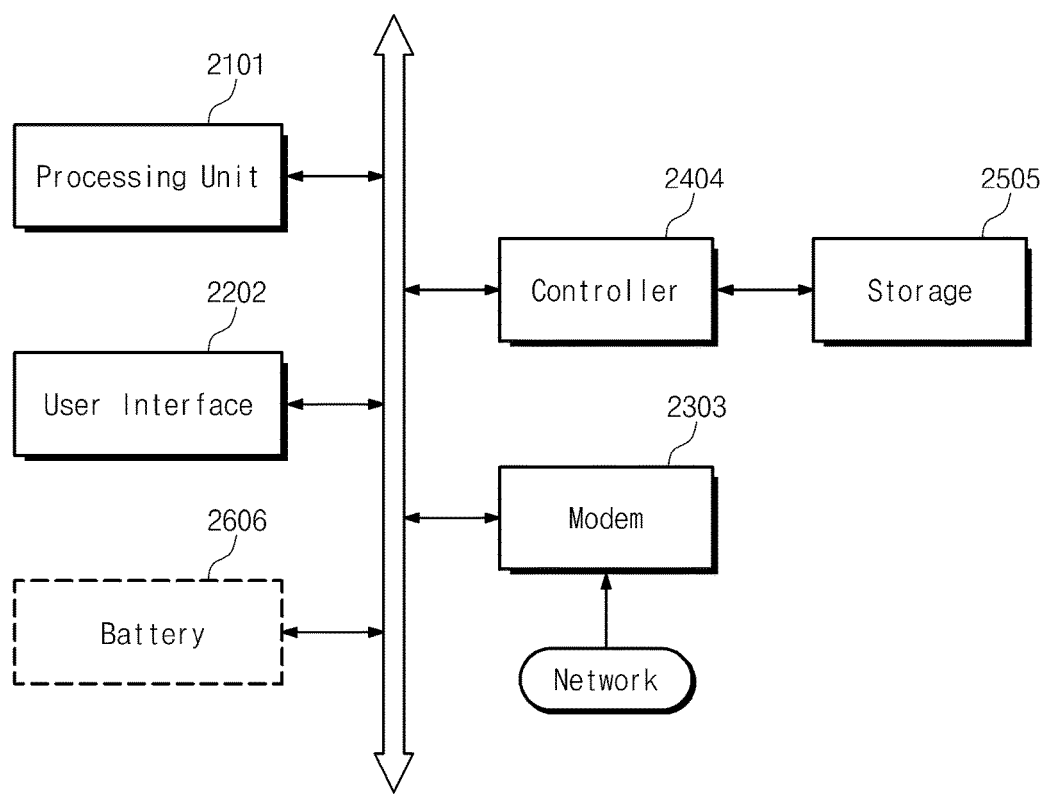
FIG. 19 is a block diagram schematically illustrating a computing system according to an embodiment of the inventive concepts.

FIG. 19 is a block diagram schematically illustrating a computing system according to an embodiment of the inventive concepts. A computing system may include a processing unit 2101, a user interface 2202, a modem 2303 such as a baseband chipset, a memory controller 2404, and storage medium 2505.

The memory controller 2404 may be configured substantially the same as illustrated in FIG. 7, and the storage medium 2505 may be formed of a nonvolatile memory device illustrated in FIG. 7. Any embodiment for managing read requested memory as described with reference to FIGS. 4A-6 and 10-16B may be applied to the memory controller 2404, for example, overhead of memory resource and search overhead may be reduced. This may mean that there is improved performance of the computing system to which techniques of managing and searching program lapse times are applied.

N-bit data (N being 1 or more integer) processed/to be processed by the processing unit 2101 may be stored in the storage medium 2505 through the memory controller 2404. In the event that the computing system is a mobile device, a battery 2606 may be further included in the computing system to supply an operating voltage thereto. Although not illustrated in FIG. 19, the computing system may further comprise an application chipset, a camera image processor (CIS), a mobile DRAM, and the like.

Figure 20:
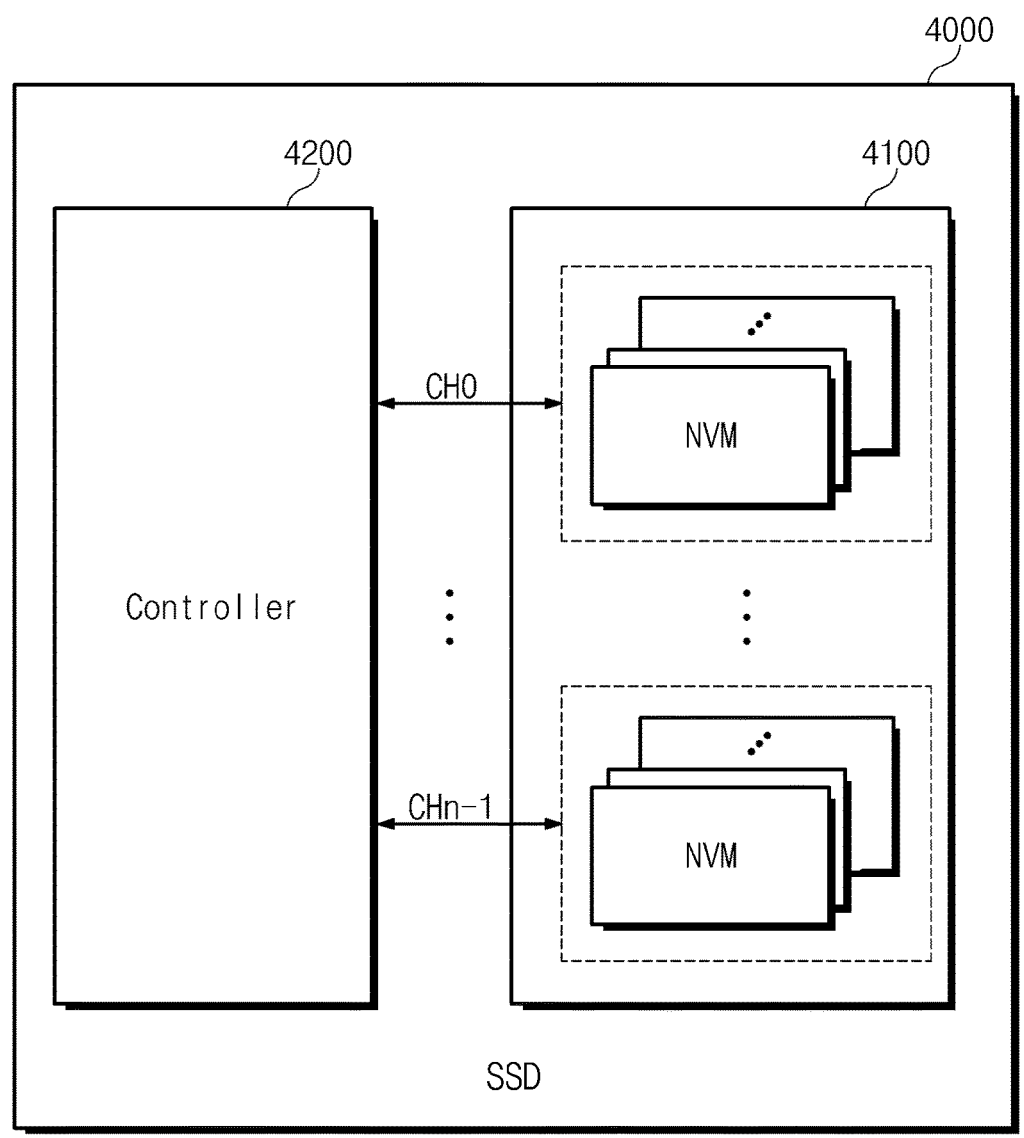
FIG. 20 is a block diagram schematically illustrating a solid state drive according to an embodiment of the inventive concepts.

FIG. 20 is a block diagram schematically illustrating a solid state drive according to an embodiment of the inventive concepts.

Referring to FIG. 20, a solid state drive (SSD) 4000 includes storage medium 4100 and a controller 4200. The storage medium 4100 may be connected to the controller 4200 via a plurality of channels, each of which is connected with a plurality of nonvolatile memories in common. The controller 4200 is configured the same as illustrated in FIG. 7, and each of nonvolatile memory devices in storage medium 4100 is formed of a nonvolatile memory device illustrated in FIG. 7. Any embodiment for managing read requested memory as described with reference to FIGS. 4A-6 and 10-16B may be applied to the memory controller 2404, for example, overhead of memory resource and search overhead may be reduced. This may mean that there is improved performance of the SSD 4000 to which techniques of managing and searching program lapse times are applied.

Figure 21:
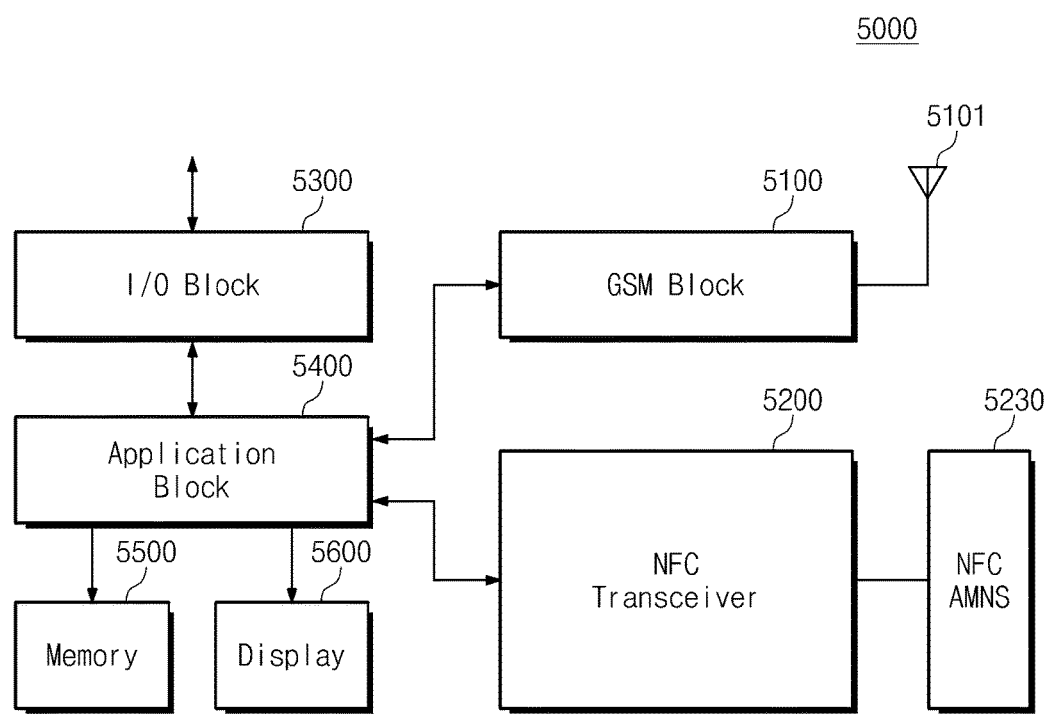
FIG. 21 is a block diagram of a user device according to an embodiment of the inventive concepts.

FIG. 21 is a block diagram of a user device according to an embodiment of the inventive concepts. A user device shown in FIG. 21 may be a mobile phone (or, referred to as a smart phone). However, it is well understood that the inventive concept is not limited to the mobile phone.

Referring to FIG. 21, a mobile phone 5000 includes a Global System for Mobile Communication (GSM) block 5100, a Near Field Communication (NFC) transceiver 5200, an NFC antenna matching network system 5230, an input/output (I/O) block 5300, an application block 5400, a memory 5500, and a display 5600. The components/blocks of the mobile phone 1000 in FIG. 21 may be shown merely by way of illustration. However, the mobile phone 100 may contain more or fewer components/blocks. Further, although described as using GSM technology, the mobile phone 100 may instead be implemented using other technologies such as CDMA (Code Division Multiple Access) also. The blocks of FIG. 21 may be implemented in an integrated circuit (IC) form. Alternatively, some of the blocks may be implemented in an IC form, while other blocks may be in a discrete form.

GSM block 5100 is connected to an antenna 101, and it operates to provide wireless telephone operations in a known way. The GSM block 5100 may contain receiver and transmitter sections internally (not shown) to perform corresponding receive and transmit operations.

The NFC transceiver 5200 uses inductive coupling for wireless communication and is configured to receive and transmit NFC signals. The NFC transceiver 5200 provides NFC signals to the NFC antenna matching network system 5230, and the NFC antenna matching network system 5230 transmits NFC signals through inductive coupling. The NFC antenna matching network system 5230 receives NFC signals (provided from another NFC device (not shown)) and provides the received NFC signals to the NFC transceiver 5200.

The NFC transceiver 5200 may operate to be consistent with specifications described in Near Field Communication Interface and Protocol-1 (NFCIP-1) and Near Field Communication Interface and Protocol-2 (NFCIP-2) and standardized in ECMA-340, ISO/IEC 18092, ETSI TS 102 190, ISO 21481, ECMA 352, ETSI TS 102 312, etc.

The application block 5400 may contain corresponding hardware circuitry (e.g., one or more processors) and may operate to provide various user applications provided by the mobile phone 5000. The user applications may include voice call operations, data transfers, etc. The application block 5400 operates in conjunction with the GSM block 5100 to provide such features.

The display 5600 displays images in response to the corresponding display signals received from the application block 5400. The images may be generated by a camera provided in mobile phone 5100, but not shown in FIG. 21. The display 5600 may contain memory (e.g., a frame buffer) internally for temporary storage of pixel values for image refresh purposes and may be implemented, for example, as a liquid crystal display screen with associated control circuits. The I/O block 5300 provides a user with the facility to provide inputs, for example, to dial numbers. In addition, the I/O block 5300 provides outputs that are received via the application block 5400.

The memory 500 may store program (instructions) and/or data used by the applications block 5400. For example, the memory 5500 may be formed of a memory system shown in FIG. 7. Any embodiment for managing read requested memory as described with reference to FIGS. 4A-6 and 10-16B may be applied to the memory controller 2404, for example, overhead of memory resource and search overhead may be reduced. This may mean that there is improved performance of the user device 5000 to which techniques of managing and searching program lapse times are applied.

Figure 22:
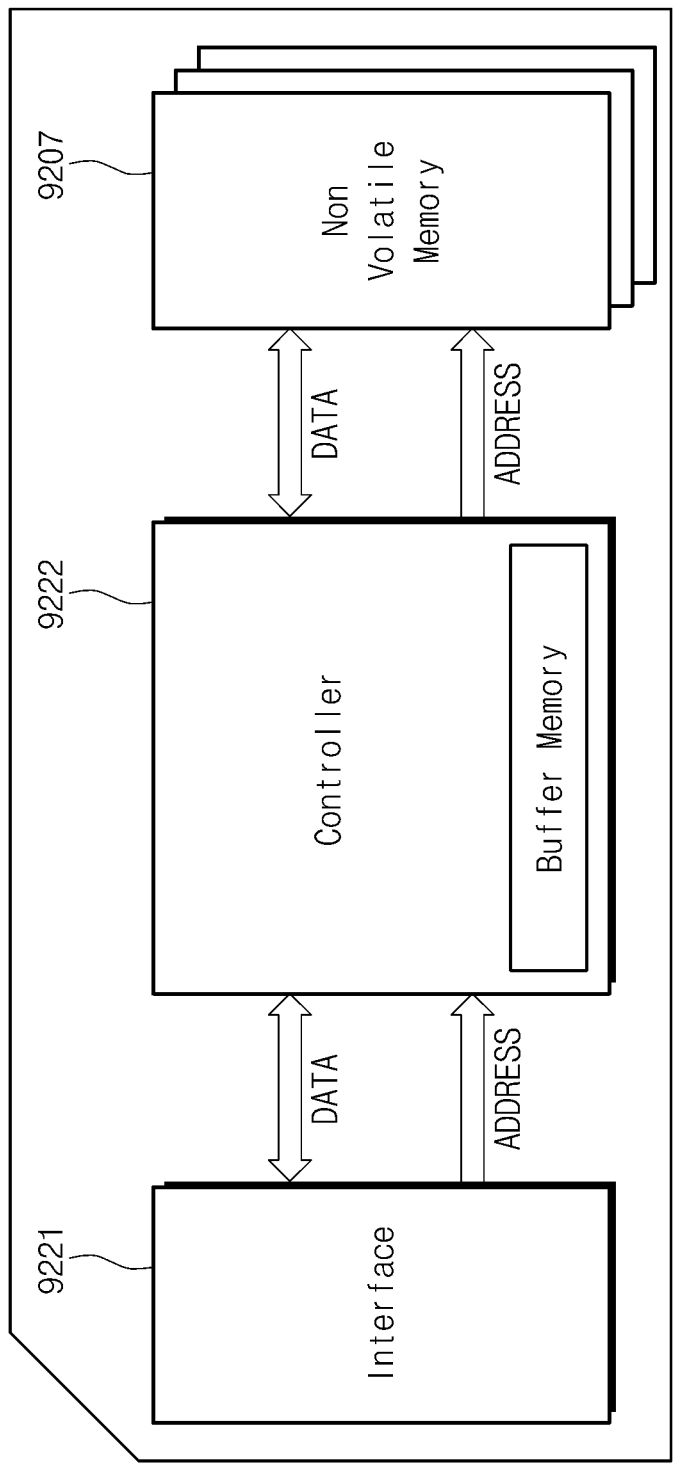
FIG. 22 is a block diagram schematically illustrating a memory card according to an embodiment of the inventive concepts.

FIG. 22 is a block diagram schematically illustrating a memory card according to an embodiment of the inventive concept.

A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 22, the memory card includes an interface circuit 9221 for interfacing with an external device, a controller 9222 including a buffer memory and controlling an operation of the memory card, and at least one nonvolatile memory device 9207. The controller 9222 may be a processor which is configured to control write and read operations of the nonvolatile memory device 9207. The controller 9222 is coupled to the nonvolatile memory device 9207 and the interface circuit 9221 via a data bus and an address bus. The interface circuit 9221 may interface with a host via a card protocol (e.g., SD/MMC) for data exchange between a host and a memory card.

The controller 9222 may be configured substantially the same as illustrated in FIG. 7, and the nonvolatile memory device 9207 may be formed of a nonvolatile memory device illustrated in FIG. 7. Any embodiment for managing read requested memory as described with reference to FIGS. 4A-6 and 10-16B may be applied to the memory controller 2404, for example, overhead of memory resource and search overhead may be reduced. This may mean that there is improved performance of the memory card to which techniques of managing and searching program lapse times are applied.

Figure 23:
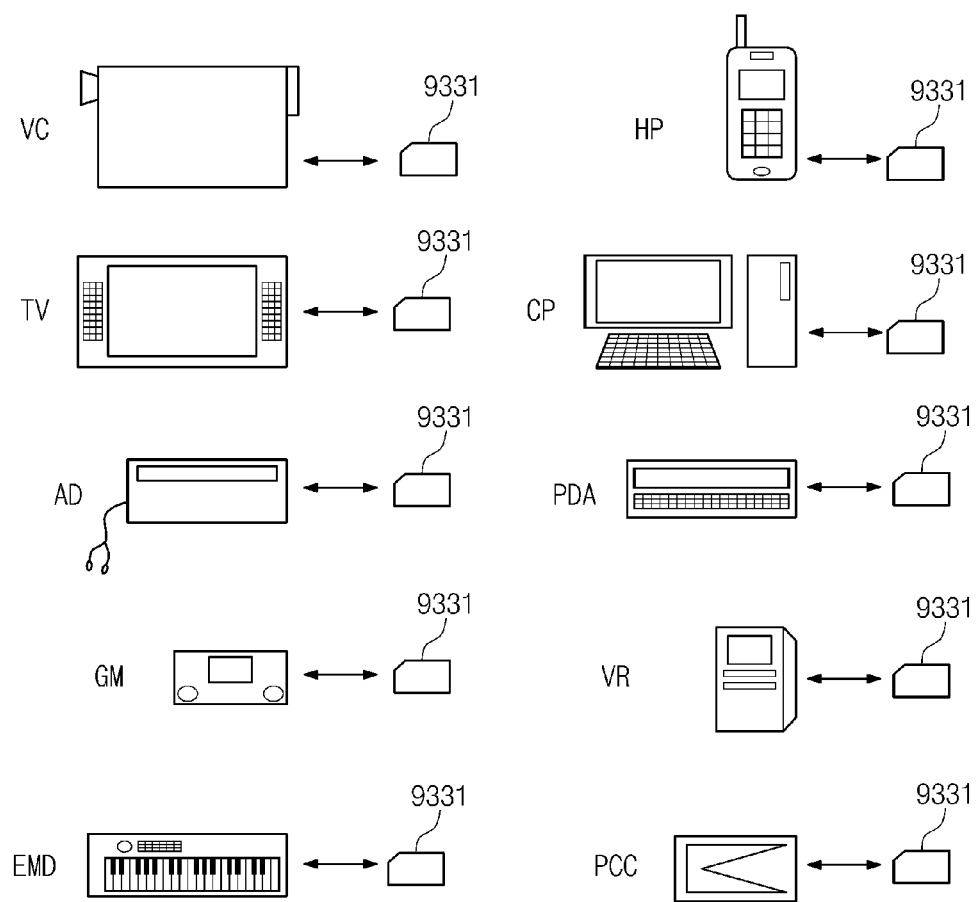
FIG. 23 is a diagram schematically illustrating various systems to which a memory card in FIG. 22 is applied.

FIG. 23 is a diagram schematically illustrating various systems to which a memory card in FIG. 22 is applied.

Referring to FIG. 23, a memory card 9331 may be applied to a video camera VC, a television TV, an audio device AD, a game machine GM, an electronic music device EMD, a cellular phone HP, a computer CP, a Personal Digital Assistant (PDA), a voice recorder VR, a PC card PCC, and the like.

In other example embodiments, memory cells can be formed of one of various cell structures having a charge storage layer. Cell structures having a charge storage layer include a charge trap flash structure using a charge trap layer, a stack flash structure in which arrays are stacked at multiple layers, a source-drain free flash structure, a pin-type flash structure, and the like.

In still other example embodiments, a memory device having a charge trap flash structure as a charge storage layer is disclosed in U.S. Pat. No. 6,858,906 and U.S. Patent Publication Nos. 2004/0169238 and 2006/0180851, the entirety of which is incorporated by reference herein. A source-drain free flash structure is disclosed in KR Patent No. 673020, the entirety of which is incorporated by reference herein.

A nonvolatile memory device and/or a memory controller according to the inventive concept may be packaged according to any of a variety of different packaging technologies. Examples of such packaging technologies may include PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

In the above described embodiments, read voltage was given as examples of the read condition. However, as was mentioned, the read condition also includes sensing conditions or a combination of read voltage and sensing conditions. Sensing conditions include a bit line develop time, a bit line pre-charge time, a bit line shut-off voltage, a sensing margin (e.g., a relationship between a bit line pre-charge voltage and a bit line shut-off voltage), and so on.

At least some example embodiments manage the program order of memory blocks in a first table and the elapsed time of only a sample of program units in a second table such that, as will be appreciated, these example embodiments provide for reduced overhead in managing the read condition based on elapsed time.

In the above described embodiments, the estimated elapsed time was used to determine a corresponding read condition. However, the embodiments are not limited to using estimated elapsed time for determining the read condition. Instead, it will be appreciated, that the estimated elapsed time determined according to example embodiment may also be used to control other memory operations. For example, refresh of memory areas of the storage medium may be controlled based on the estimated elapsed time.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

We claim:

1. A method of operating a non-volatile memory, the method comprising:
   receiving a read request for at least a portion of a memory area from among a plurality of memory areas of a memory, the read request including read address information for the portion of the memory area;
   obtaining programming order information for the memory area from a first table based on the read address information, the programming order information indicating an order in which the memory area was programmed, entries included in the first table correspond to memory areas, from among the plurality of the memory areas, being handled within a stabilization time of a memory cell;
   determining an estimated elapsed time by accessing a second table based on the obtained programming order information, the estimated elapsed time indicating time that has elapsed since the portion of the memory area was last programmed;
   adjusting a read voltage level based on the estimated elapsed time; and
   reading data from the portion of the memory area based on the adjusted read voltage level, the adjusted read voltage level being higher than a default read voltage.

2. The method of claim 1, wherein the determining comprising:
   determining an index indicating a programming order of the portion of the memory area based on the obtained programming order information; and
   accessing the second table using the index to obtain elapsed time information, the second table indicating elapsed times associated with a plurality of indexes.

3. The method of claim 2, wherein
   the elapsed time information is associated with a first of the plurality of indexes; and
   the first of the plurality of indexes is an index, from among the plurality of indexes, that is (1) closest to the determined index and (2) less than or equal to the determined index.

4. The method of claim 2, wherein
the elapsed time information is associated with a first of the plurality of indexes; and
the first of the plurality of indexes is an index, from among the plurality of indexes, that is (1) closest to the determined index and (2) greater than or equal to the determined index.

5. The method of claim 2, wherein
the elapsed time information includes a first elapsed time and a second elapsed time;
the first elapsed time is associated with a first of the plurality of indexes;
the first of the plurality of indexes is an index, from among the plurality of indexes, that is (1) closest to the determined index and (2) less than or equal to the determined index;
the second elapsed time is associated with a second of the plurality of indexes; and
the second of the plurality of indexes is an index, from among the plurality of indexes, that is (1) closest to the determined index and (2) greater than or equal to the determined index.

6. The method of claim 1, further comprising:
determining whether a shortest elapsed time associated with entries in the second table exceeds a reference time; and
controlling the memory based on default information without conducting the obtaining programming order information.

7. The method of claim 1, wherein
the memory area is a block, and the address information includes block address information and page address information; and
the obtaining programming order information accesses the first table using the block address information.

8. The method of claim 7, wherein the determining an estimated elapsed time comprises:
calculating an index based on the obtained programming order information and the page address information; and
accessing the second table based on the calculated index.

9. The method of claim 1, wherein the second table includes a plurality of sub tables, each sub table associated with a different magnitude of elapsed times.

10. The method of claim 1, wherein the memory is a vertical NAND.

11. The method of claim 1, wherein memory cells of the memory are a charge trap type.

12. The method of claim 1, further comprising:
programming data into at least the portion of the memory area;
storing address information for the memory area in the first table based on the order in which the memory area was programmed with respect to other memory areas having address information stored in the first table;
determining an index of the portion of the memory area based on write address information received with the data; and
storing the index in one of a plurality of entries of the second table based on an order in which the portion was programmed with respect to other portions having indexes stored in the second table, each of the plurality of entries of the second table associated with an elapsed time, the elapsed time indicating a time that has elapsed since programming the portion stored in the entry.

13. The method of claim 12, further comprising:
storing a first pointer indicating which of the address information in the first table was most recently programmed.

14. The method of claim 13, further comprising:
storing a second pointer indicating which of the plurality of entries in the second table has a reference elapsed time.

15. The method of claim 14, wherein the reference elapsed time is zero seconds.

16. The method of claim 14, further comprising:
changing the second pointer as time elapses.

17. A method for performing a read operation for a non-volatile memory including a plurality of memory cell strings, each of the plurality of memory cell strings including a plurality of memory cells stacked in a direction perpendicular to a substrate, the method comprising:
receiving a read request for at least a portion of a memory area of a memory from among a plurality of memory areas, the read request including read address information for the portion of the memory area;
obtaining programming order information for the memory area from a first table based on the read address information, the programming order information indicating an order in which the memory area was programmed, entries included in the first table correspond to memory areas, from among the plurality of the memory areas, being handled within a stabilization time of a memory cell;
reading data based on programming order information;
wherein the method further includes
applying a default read voltage to the memory area when the first table does not include programming order information for the memory area, and
determining a read voltage level, which is higher than the default read voltage, according to an estimated elapsed time by accessing a second table based on the obtained programming order information when the first table includes programming order information; and
wherein the estimated elapsed time indicates time that has elapsed since the portion of the memory area was last programmed.

18. The method of claim 17, wherein the determining comprises:
determining an index indicating a programming order of the portion of the memory area based on the obtained programming order information; and
accessing the second table using the index to obtain elapsed time information, the second table indicating elapsed times associated with a plurality of indexes.

19. The method of claim 18, wherein
the elapsed time information is associated with a first of the plurality of indexes; and
the first of the plurality of indexes is an index, from among the plurality of indexes, that is (1) closest to the determined index and (2) less than or equal to the determined index.

20. The method of claim 18, wherein
the elapsed time information is associated with a first of the plurality of indexes; and
the first of the plurality of indexes is an index, from among the plurality of indexes, that is (1) closest to the determined index and (2) greater than or equal to the determined index.

21. The method of claim 18, wherein
the elapsed time information includes a first elapsed time and a second elapsed time;
the first elapsed time is associated with a first of the plurality of indexes;
the first of the plurality of indexes is an index, from among the plurality of indexes, that is (1) closest to the determined index and (2) less than or equal to the determined index;
the second elapsed time is associated with a second of the plurality of indexes; and
the second of the plurality of indexes is an index, from among the plurality of indexes, that is (1) closest to the determined index and (2) greater than or equal to the determined index.

* * * * *